United States Patent
Hartlove et al.

(10) Patent No.: US 10,985,296 B2
(45) Date of Patent: Apr. 20, 2021

(54) QUANTUM DOT BASED COLOR CONVERSION LAYER IN DISPLAY DEVICES

(71) Applicant: Nanosys, Inc., Milpitas, CA (US)

(72) Inventors: Jason Hartlove, Los Altos, CA (US); Veeral Hardev, Redwood City, CA (US); Shihai Kan, San Jose, CA (US); Jian Chen, Saratoga, CA (US); Jay Yamanaga, Campbell, CA (US); Christian Ippen, Cupertino, CA (US); Wenzhuo Guo, San Jose, CA (US); Charles Hotz, San Rafael, CA (US); Robert Wilson, Palo Alto, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 16/697,436

(22) Filed: Nov. 27, 2019

(65) Prior Publication Data
US 2020/0098951 A1     Mar. 26, 2020

Related U.S. Application Data

(60) Division of application No. 16/176,889, filed on Oct. 31, 2018, now Pat. No. 10,497,841, which is a
(Continued)

(51) Int. Cl.
*H01L 33/50* (2010.01)
*H05B 33/14* (2006.01)
(Continued)

(52) U.S. Cl.
CPC .......... *H01L 33/502* (2013.01); *B01J 13/08* (2013.01); *C09K 11/025* (2013.01);
(Continued)

(58) Field of Classification Search
CPC ........ B01J 13/08; B82Y 20/00; C09K 11/025; C09K 11/883; H01L 27/322; H01L 33/502; H05B 33/14; H05B 33/20
See application file for complete search history.

(56) References Cited

U.S. PATENT DOCUMENTS 6,413,489 B1  7/2002  Ying et al.
7,005,669 B1  2/2006  Lee
(Continued)

FOREIGN PATENT DOCUMENTS

EP    2 853 578 A1       4/2015
WO    WO 2014/208456 A1  12/2014
WO    WO 2015/109161 A1  7/2015

OTHER PUBLICATIONS

International Search Report and Written Opinion directed to related International Patent Application No. PCT/US2016/064720, dated Feb. 23, 2017; 14 pages.
(Continued)

*Primary Examiner* — Allan R Wilson
(74) *Attorney, Agent, or Firm* — Sterne, Kessler, Goldstein & Fox P.L.L.C.

(57) ABSTRACT

Embodiments of a display device including barrier layer coated quantum dots and a method of making the barrier layer coated quantum dots are described. Each of the barrier layer coated quantum dots includes a core-shell structure and a hydrophobic barrier layer disposed on the core-shell structure. The hydrophobic barrier layer is configured to provide a distance between the core-shell structure of one of the quantum dots with the core-shell structures of other quantum dots that are in substantial contact with the one of the quantum dots. The method for making the barrier layer coated quantum dots includes forming reverse micro-micelles using surfactants and incorporating quantum dots into the reverse micro-micelles. The method further includes
(Continued)

individually coating the incorporated quantum dots with a barrier layer and isolating the barrier layer coated quantum dots with the surfactants of the reverse micro-micelles disposed on the barrier layer.

8 Claims, 8 Drawing Sheets

Related U.S. Application Data continuation of application No. 15/368,334, filed on Dec. 2, 2016, now Pat. No. 10,128,417.

(60) Provisional application No. 62/262,241, filed on Dec. 2, 2015.

(51) Int. Cl.

| | | |
|---|---|---|
| *H05B 33/20* | (2006.01) | |
| *B01J 13/08* | (2006.01) | |
| *C09K 11/02* | (2006.01) | |
| *C09K 11/88* | (2006.01) | |
| *H01L 27/32* | (2006.01) | |
| *B82Y 20/00* | (2011.01) | |
| *B82Y 40/00* | (2011.01) | |

(52) U.S. Cl.
CPC .......... *C09K 11/883* (2013.01); *H01L 27/322* (2013.01); *H05B 33/14* (2013.01); *H05B 33/20* (2013.01); *B82Y 20/00* (2013.01); *B82Y 40/00* (2013.01); *C01P 2004/64* (2013.01); *H01L 2251/5369* (2013.01); *H01L 2933/0083* (2013.01); *Y10S 977/774* (2013.01); *Y10S 977/815* (2013.01); *Y10S 977/824* (2013.01); *Y10S 977/892* (2013.01); *Y10S 977/95* (2013.01); *Y10S 977/952* (2013.01)

(56) References Cited

U.S. PATENT DOCUMENTS

| | | | |
|---|---|---|---|
| 9,005,480 | B2 | 4/2015 | Furuta et al. |
| 9,780,266 | B2 | 10/2017 | Lotito et al. |
| 9,793,446 | B2 * | 10/2017 | Kurtin .................. C09K 11/565 |
| 10,056,533 | B2 | 8/2018 | Kan et al. |
| 10,128,417 | B2 | 11/2018 | Hartlove et al. |
| 10,243,114 | B2 | 3/2019 | Hartlove et al. |
| 10,475,971 | B2 | 11/2019 | Kan et al. |
| 10,497,841 | B2 | 12/2019 | Hartlove et al. |
| 10,550,325 | B2 | 2/2020 | Kan |
| 2003/0066998 | A1 | 4/2003 | Lee |
| 2007/0057263 | A1 | 3/2007 | Kahen |
| 2007/0269586 | A1 | 11/2007 | Leatherdale et al. |
| 2008/0302977 | A1 | 12/2008 | Yao et al. |
| 2009/0109435 | A1 | 4/2009 | Kahen et al. |
| 2010/0140586 | A1 | 6/2010 | Char et al. |
| 2011/0089809 | A1 | 4/2011 | Noh |
| 2013/0112942 | A1 | 5/2013 | Kurtin et al. |
| 2013/0189803 | A1 | 7/2013 | Nasaani et al. |
| 2013/0345458 | A1 | 12/2013 | Freeman et al. |
| 2014/0049155 | A1 | 2/2014 | Kurtin |
| 2014/0264189 | A1 | 9/2014 | Furuta et al. |
| 2014/0275598 | A1 | 9/2014 | Freeman et al. |
| 2014/0288351 | A1 | 9/2014 | Jones |
| 2015/0008393 | A1 | 1/2015 | Mangum et al. |
| 2015/0011029 | A1 | 1/2015 | Mangum et al. |
| 2015/0053914 | A1 | 2/2015 | Kurtin et al. |
| 2015/0062967 | A1 | 3/2015 | Bae et al. |
| 2015/0109814 | A1 | 4/2015 | Chen et al. |
| 2015/0261076 | A1 | 9/2015 | Dijken et al. |
| 2015/0318455 | A1 | 11/2015 | Kurtin et al. |
| 2016/0137916 | A1 | 5/2016 | Wachi |
| 2016/0342282 | A1 | 11/2016 | Wassvik |
| 2017/0029697 | A1 | 2/2017 | Ghosh et al. |
| 2017/0096538 | A1 | 4/2017 | Sasaki et al. |
| 2017/0110625 | A1 | 4/2017 | Zhao et al. |
| 2017/0141162 | A1 * | 5/2017 | Kim .................... H01L 51/5265 |
| 2017/0162756 | A1 | 6/2017 | Hartlove et al. |
| 2017/0162764 | A1 | 6/2017 | Kan et al. |
| 2017/0211756 | A1 | 7/2017 | Koole et al. |
| 2017/0248748 | A1 | 8/2017 | Satake et al. |
| 2017/0255056 | A1 * | 9/2017 | Liu .................... G02F 1/133512 |
| 2018/0120492 | A1 * | 5/2018 | Lee .................... G02F 1/133621 |
| 2018/0198035 | A1 | 7/2018 | Hartlove et al. |
| 2018/0331262 | A1 | 11/2018 | Kan et al. |
| 2019/0088830 | A1 | 3/2019 | Hartlove et al. |
| 2020/0035881 | A1 | 1/2020 | Kan et al. |

OTHER PUBLICATIONS

Ziegleri et al., "Silica-Coated InP/ZnS Nanocrystals as Converter Material in White LEDs," Advanced Materials, WILEY—VCH Verlag GMBH & Co. KGaA, DE, vol. 20, No. 21, Nov. 3, 2008; pp. 4068-4073.

Wu et al., "Synthesis of mesoporous silica nanoparticles," Chemical Society Reviews, vol. 42, No. 9, May 7, 2013; p. 3862-3875.

Nann et al., "Single Quantum Dots in Spherical Silica Particles," Angewandte Chemie International Edition, vol. 43, No. 40, Oct. 11, 2004; pp. 5393-5396.

Koole, R., et al., "On the Incorporation Mechanism of Hydrophobic Quantum Dots in Silica Spheres by a Reverse Microemulsion Method," *Chem. Mater.* 20:2503-2512, American Chemical Society (2008).

Williams, A.T.R., et al., "Relative Fluorescence Quantum Yields Using a Computer-controlled Luminescence Spectrometer," *Analyst* 108:1067-1071, Royal Society of Chemistry, United Kingdom (1983).

Notice of Allowance for U.S. Appl. No. 15/368,344, filed Dec. 2, 2016, inventors: Kan, S. et al., United States Patent and Trademark Office, Alexandria, VA, dated Dec. 8, 2017.

International Search Report and Written Opinion directed to related International Patent Application No. PCT/US2016/064722, dated Mar. 29, 2017; 11 pages (Not a Corresponding Application).

Office Action for copending U.S. Appl. No. 15/788,346, filed Oct. 19, 2017, U.S. Patent and Trademark Office, Alexandria, Virginia, dated Mar. 12, 2020.

Office Action for coopending U.S. Appl. No. 15/788,346, filed Oct. 19, 2017, U.S. Patent and Trademark Office, Alexandria, Virginia, dated Nov. 19, 2020.

* cited by examiner

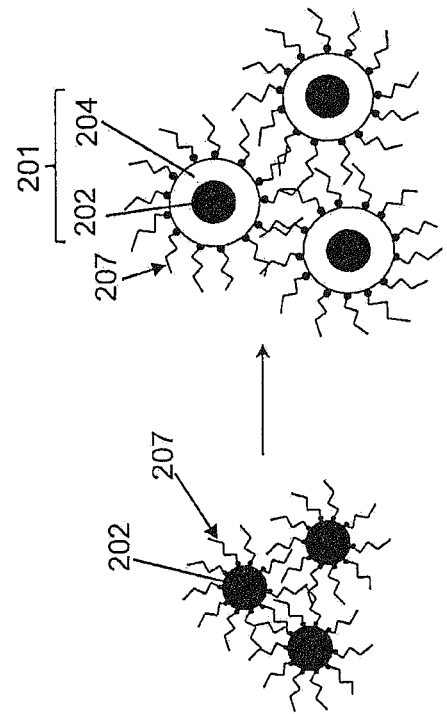
FIG. 2A
FIG. 2B
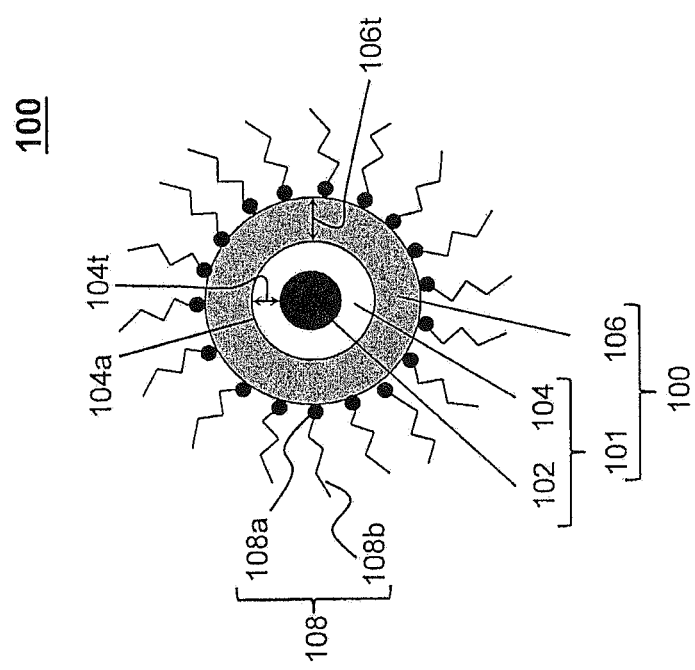
FIG. 1

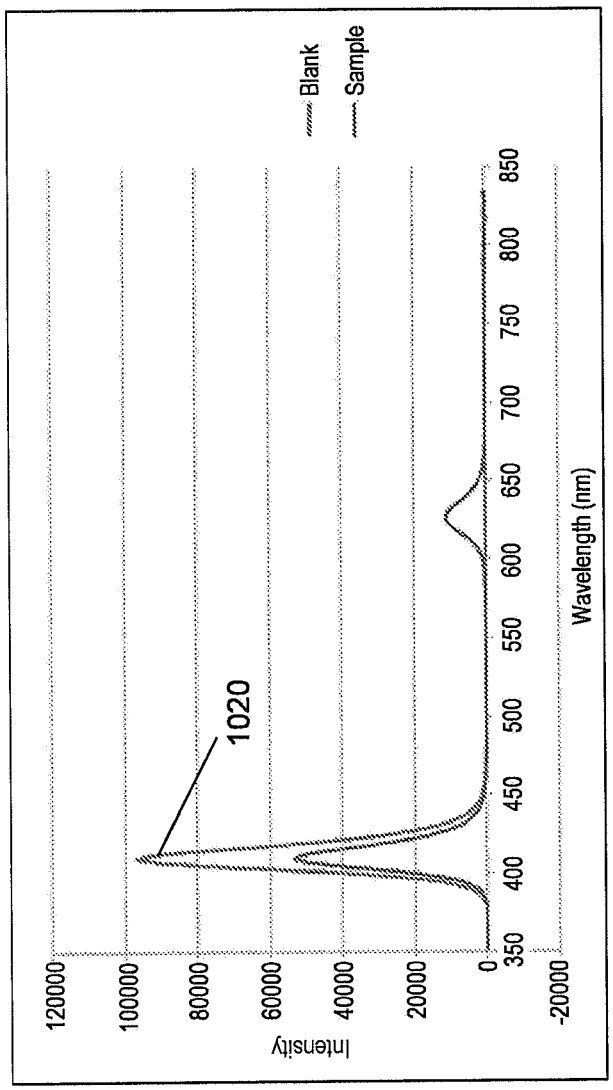
FIG. 9
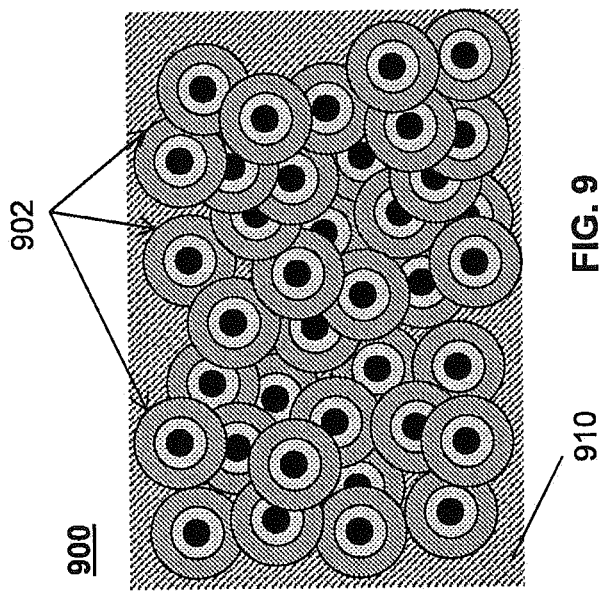
FIG. 9A
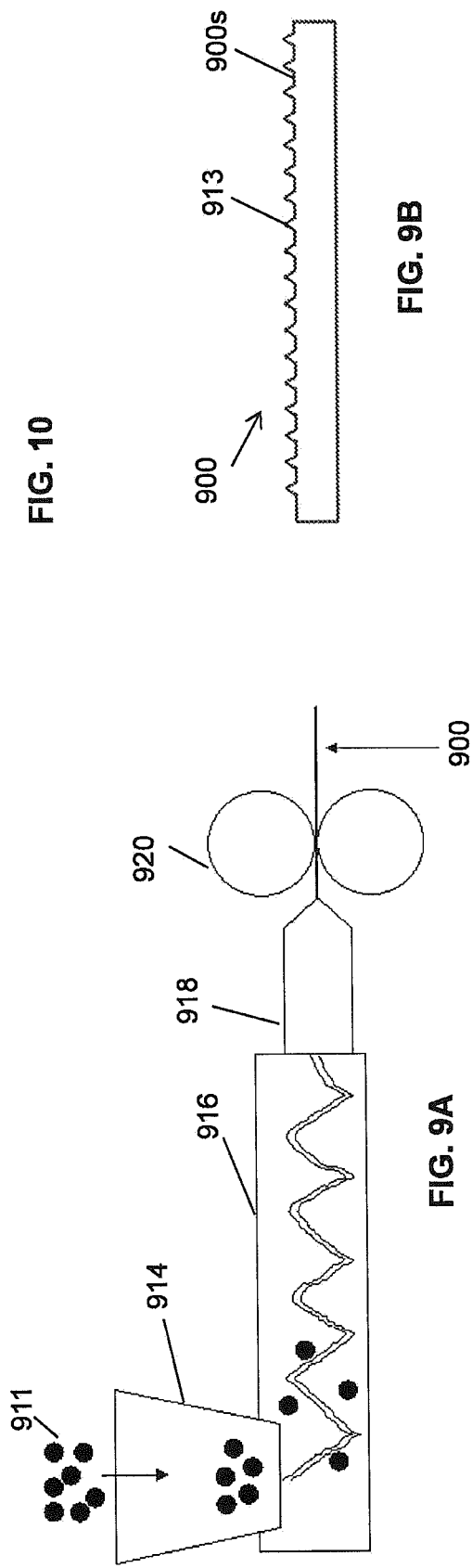
FIG. 9B
FIG. 10

QUANTUM DOT BASED COLOR CONVERSION LAYER IN DISPLAY DEVICES

CROSS REFERENCE TO RELATED APPLICATIONS

This application is a divisional of U.S. application Ser. No. 16/176,889, filed Oct. 31, 2018, which is a continuation of U.S. application Ser. No. 15/368,334, filed Dec. 2, 2016, now U.S. Pat. No. 10,128,417, issued Nov. 13, 2018, which claims priority to U.S. Provisional Appl. No. 62/262,241, filed Dec. 2, 2015, each of which is incorporated by reference herein in their entireties.

BACKGROUND OF THE INVENTION

Field

The present invention relates to display devices including highly luminescent quantum dots (QDs) comprising a core-shell structure.

Background

Quantum dots (QDs) have the unique ability to emit light at a single spectral peak with narrow line width, creating highly saturated colors. It is possible to tune the emission wavelength based on the size of the QDs. This ability to tune the emission wavelength enables display engineers to custom engineer a spectrum of light to maximize both the efficiency and color performance of the display.

The size-dependent properties of QDs are used to produce a QD film. The QD film may be used as a color down conversion layer in display devices. The use of a color down conversion layer in emissive displays can improve the system efficiency by down-converting white light to a more reddish light, greenish light, or both before the light passes through a color filter. This use of a color down conversion layer may reduce loss of light energy due to filtering.

QDs may be used as the conversion material due to their broad absorption and narrow emission spectra. Because, the density of QDs required for such application is very high in a very thin color down conversion layer of about 3 µm-6 µm, QDs prepared using current methods suffer from quenching of their optical properties when the QDs are closely packed next to each other in a thin QD film. As such, current QD-based display devices using QD films as color down conversion layers suffer from low quantum yield (QY).

SUMMARY

Accordingly, there is need to increase the quality of display devices. Disclosed herein are embodiments that overcome the above mentioned limitations of display devices.

According to an embodiment, a method of making barrier layer coated quantum dots includes forming a solution of reverse micro-micelles using surfactants and incorporating quantum dots into the reverse micro-micelles. The method further includes individually coating the quantum dots with a barrier layer to form barrier layer coated quantum dots and isolating the barrier layer coated quantum dots with the surfactants of the reverse micro-micelles disposed on the barrier layer.

According to an embodiment, the incorporating of the quantum dots into the reverse micro-micelles includes forming a first mixture of the quantum dots and the solution of reverse micelles.

According to an embodiment, the individually coating of the quantum dots with a barrier layer includes forming a second mixture of a precursor and the first mixture and forming a third mixture of a catalyst and the second mixture.

According to an embodiment, the isolating of the barrier layer coated quantum dots includes heating the third mixture at or below a temperature of about 50° C. under vacuum.

According to an embodiment, the barrier layer coated quantum dots exhibit a quantum yield greater than about 80%.

According to an embodiment, the barrier layer coated quantum dots exhibit a quantum yield greater than about 90%.

According to an embodiment, the barrier layer coated quantum dots exhibit a quantum yield in a range of about 85% to about 95%.

According to an embodiment, the quantum dots and the barrier layer coated quantum dots exhibit a quantum yield greater than about 80%.

According to an embodiment, the quantum dots and the barrier layer coated quantum dots exhibit a quantum yield greater than about 85%.

According to an embodiment, the barrier layer coated quantum dots have an average size ranging from about 20 nm and to about 40 nm in diameter.

According to an embodiment, the barrier layer coated quantum dots have an average size ranging from about 25 nm and to about 35 nm in diameter.

According to an embodiment, the barrier layer includes an oxide.

According to an embodiment, the barrier layer includes silicon oxide.

According to an embodiment, a quantum dot film includes barrier layer coated quantum dots. Each of the barrier layer coated quantum dots includes a quantum dot and an optically transparent barrier layer disposed on the quantum dot. The optically transparent barrier layer is configured to provide a spacing between adjacent quantum dots to prevent aggregation of the adjacent quantum dots. The quantum dot film further includes a matrix material configured to house the barrier layer coated quantum dots and be in substantial contact with the optically transparent barrier layer. The barrier layer coated quantum dots exhibit a quantum yield greater than about 80%.

According to an embodiment, the optically transparent barrier layer is hydrophobic.

According to an embodiment, the spacing is equal or greater than a Forster radius between adjacent barrier layer coated quantum dots.

According to an embodiment, the quantum dot of each of the barrier layer coated quantum dots includes a core-shell structure having a core and a shell surrounding the core.

According to an embodiment, the core includes a first material, the shell includes a second material, and the optically transparent barrier layer includes a third material. The first, second, and third materials are different from each other.

According to an embodiment, the optically transparent barrier layer includes an oxide.

According to an embodiment, the optically transparent barrier layer includes silicon oxide.

According to an embodiment, the quantum dot film further includes surfactants or ligands bonded to the optically transparent barrier layer.

According to an embodiment, the quantum dot film exhibits an external quantum efficiency greater than about 50% after being treated at a temperature greater than 200° C.

According to an embodiment, the quantum dot film includes an optical density greater than about 0.24 and an external quantum efficiency greater than about 50%.

According to an embodiment, the barrier layer coated quantum dots have an average size ranging from about 20 nm and to about 40 nm in diameter.

According to an embodiment, the optically transparent barrier layer has a thickness ranging from about 8 nm and to about 20 nm in diameter.

According to an embodiment, the matrix material includes an extrudable material.

According to an embodiment, the matrix material includes a brightness enhancement film.

According to an embodiment, the matrix material includes a polymer plastic film.

According to an embodiment, the quantum dot film includes a thickness in a range from about 70 µm to about 40 µm.

According to an embodiment, a display device includes an organic layer that emits a broadband radiation and a quantum dot film disposed on the organic layer. The quantum dot film includes barrier layer coated quantum dots that absorb a set of wavelengths of the broadband radiation and emit at a primary emission peak wavelength, where the set of wavelengths is smaller than the primary emission peak wavelength. Each of the barrier layer coated quantum dots includes a core-shell quantum dot and an optically transparent barrier layer surrounding the core-shell quantum dot. The barrier layer coated quantum dots exhibit a quantum yield greater than about 80%. The quantum dot film further includes a matrix material configured to house the barrier layer coated quantum dots and be in substantial contact with the optically transparent barrier layer. The display device further includes an optical element, disposed on the quantum dot film, configured to block another set of wavelengths of the broadband radiation that are greater than the primary emission peak wavelength.

According to an embodiment, the optically transparent barrier layer is configured to provide a spacing between adjacent barrier layer coated quantum dot to prevent their aggregation.

According to an embodiment, the spacing is equal or greater than a Forster radius between adjacent barrier layer coated quantum dots.

According to an embodiment, the organic layer, the quantum dot film, and the optical element are part of a pixel unit of the display device.

According to an embodiment, the optical element is a color filter.

According to an embodiment, the barrier layer includes an oxide.

According to an embodiment, the quantum dot film further includes surfactants or ligands bonded to the optically transparent barrier layer.

According to an embodiment, the optically transparent barrier layer is configured to protect the core-shell quantum dot from degradation by light flux, heat, oxygen, moisture, or a combination thereof.

According to an embodiment, a light emitting diode (LED) device includes a light source unit, a quantum dot film disposed on the light source unit, and an optical element disposed on the quantum dot film.

According to an embodiment, a method of making the barrier layer coated quantum dots includes forming a solution of reverse micro-micelles using surfactants, incorporating quantum dots into the reverse micro-micelles, individually coating the quantum dots with a barrier layer to form the barrier layer coated quantum dots, and performing an acid etch treatment of the barrier layer coated quantum dots.

According to an embodiment, the method further includes isolating the barrier layer coated quantum dots with the surfactants of the reverse micro-micelles disposed on the barrier layer after the performing of the acid etch treatment.

According to an embodiment, the incorporating of the quantum dots into the reverse micro-micelles includes forming a first mixture of the quantum dots and the solution of reverse micelles.

According to an embodiment, the individually coating of the quantum dots with the barrier layer includes forming a second mixture of a precursor and the first mixture and forming a third mixture of a catalyst and the second mixture.

According to an embodiment, the performing of the acid etch treatment of the barrier layer quantum dots includes forming a fourth mixture of an acid and the third mixture.

According to an embodiment, the performing of the acid etch treatment of the barrier layer quantum dots includes selectively removing the catalyst and forming a fourth mixture of an acid and the third mixture.

According to an embodiment, the acid includes acetic acid, hydrochloric acid, nitric acid, or a fatty acid.

According to an embodiment, a method of making a quantum dot film includes forming barrier layer coated quantum dots, forming a homogenous mixture of the barrier layer quantum dots and a matrix material, and performing an extrusion process on the homogenous mixture.

According to an embodiment, the performing of the extrusion process includes introducing the homogenous mixture into a hopper, extruding a film having the barrier layer coated quantum dots and the matrix material through a slot die, and passing the extruded film through chill rolls.

According to an embodiment, the matrix material includes an extrudable material.

According to an embodiment, the matrix material includes a polymer plastic film.

According to an embodiment, the quantum dot film includes a thickness in a range from about 70 µm to about 40 µm.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments and, together with the description, further serve to explain the principles of the present embodiments and to enable a person skilled in the relevant art(s) to make and use the present embodiments.

FIG. 1 illustrates a cross-sectional structure of a barrier layer coated QD, according to an embodiment.

FIGS. 2A-2B illustrate a process of forming core-shell QDs, according to an embodiment.

FIG. 9 illustrates a QD film, according to an embodiment.

FIG. 9A illustrates a method of forming a QD film, according to an embodiment.

FIG. 9B illustrates a cross-sectional view of the QD film of FIG. 9, according to an embodiment.

FIG. 10 illustrates an example optical characteristics of a QD film, according to an embodiment.

Figure 3B:
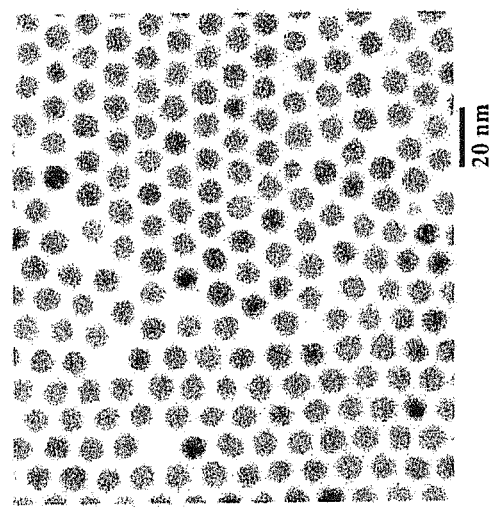
FIGS. 3A-3B illustrate transmission electron micrographs of CdSe based QDs, according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

The term "about" as used herein indicates the value of a given quantity varies by ±10% of the value, or optionally ±5% of the value, or in some embodiments, by ±1% of the value so described. For example, "about 100 nm" encompasses a range of sizes from 90 nm to 110 nm, inclusive.

The term "forming a reaction mixture" or "forming a mixture" as used herein refers to combining at least two components in a container under conditions suitable for the components to react with one another and form a third component.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well- characterized standard samples with known quantum yield values.

The term "primary emission peak wavelength" as used herein refers to the wavelength at which the emission spectrum exhibits the highest intensity.

The term "full width at half-maximum" (FWHM) as used herein refers to a measure of the size distribution of QDs. The emission spectra of QDs generally have the shape of a Gaussian curve. The width of the Gaussian curve is defined as the FWHM and gives an idea of the size distribution of the QDs. A smaller FWHM corresponds to a narrower size distribution of the QDs. FWHM is also dependent upon the emission wavelength maximum.

The term Forster radius used herein is also referred as Forster distance in the art.

An Example Embodiment of a barrier layer coated QD Structure

FIG. 1 illustrates a cross-sectional structure of a barrier layer coated QD 100, according to an embodiment. Barrier layer coated QD 100 includes a QD 101 and a barrier layer 106. QD 101 includes a core 102 and a shell 104. Core 102 includes a semiconducting material that emits light upon absorption of higher energies. Examples of the semiconducting material for core 102 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap may be used as well. In an embodiment, core 102 may also include one or more dopants such as metals, alloys, to provide some examples. Examples of metal dopant may include, but not limited to, zinc (Zn), Copper (Cu), aluminum (Al), platinum (Pt), chrome (Cr), tungsten (W), palladium (Pd), or a combination thereof. The presence of one or more dopants in core 102 may improve structural and optical stability and QY of QD 101 compared to undoped QDs.

Core 102 may have a size of less than 20 nm in diameter, according to an embodiment. In another embodiment, core 102 may have a size between about 1 nm and about 5 nm in diameter. The ability to tailor the size of core 102, and consequently the size of QD 101 in the nanometer range enables photoemission coverage in the entire optical spectrum. In general, the larger QDs emit light towards the red end of the spectrum, while smaller QDs emit light towards the blue end of the spectrum. This effect arises as larger QDs have energy levels that are more closely spaced than the smaller QDs. This allows the QD to absorb photons containing less energy, i.e. those closer to the red end of the spectrum.

Shell 104 surrounds core 102 and is disposed on outer surface of core 102. Shell 104 may include cadmium sulfide (CdS), zinc cadmium sulfide (ZnCdS), zinc selenide sulfide (ZnSeS), and zinc sulfide (ZnS). In an embodiment, shell 104 may have a thickness 104t, for example, one or more monolayers. In other embodiments, shell 104 may have a thickness 104t between about 1 nm and about 5 nm. Shell 104 may be utilized to help reduce the lattice mismatch with core 102 and improve the QY of QD 101. Shell 104 may also help to passivate and remove surface trap states, such as dangling bonds, on core 102 to increase QY of QD 101. The presence of surface trap states may provide non-radiative recombination centers and contribute to lowered emission efficiency of QD 101.

In alternate embodiments, QD 101 may include a second shell disposed on shell 104, or more than two shells surrounding core 102, without departing from the spirit and scope of the present invention. In an embodiment, the second shell may be on the order of two monolayers thick and is typically, though not required, also a semiconducting material. Second shell may provide protection to core 102. Second shell material may be zinc sulfide (ZnS), although other materials may be used as well without deviating from the scope or spirit of the invention.

Barrier layer 106 is configured to form a coating on QD 101. In an embodiment, barrier layer 106 is disposed on and in substantial contact with outer surface 104a of shell 104. In embodiments of QD 101 having one or more shells, barrier layer 106 may be disposed on and in substantial contact with the outermost shell of QD 101. In an example embodiment, barrier layer 106 is configured to act as a spacer between QD 101 and one or more QDs in, for example, a solution, a composition, and/or a film having a plurality of QDs, where the plurality of QDs may be similar to QD 101 and/or barrier layer coated QD 100. In such QD solutions, QD compositions, and/or QD films, barrier layer 106 may help to prevent aggregation of QD 101 with adjacent QDs. Aggregation of QD 101 with adjacent QDs may lead to increase in size of QD 101 and consequent reduction or quenching in the optical emission properties of the aggregated QD (not shown) including QD 101. As discussed above, optical characteristics of QDs are size dependent, and thus increase in QD size due to aggregation leads to the quenching phenomenon, which may lead to decrease in QY of QD 101. Barrier layer 106 may also prevent QD 101 from reabsorbing optical emissions from other QDs in the QD solutions, QD compositions, and/or QD films and thus, improve the QY of these QD solutions, QD compositions, and/or QD films. In further embodiments, barrier layer 106 provides protection to QD 101 from, for example, moisture, air, and/or harsh environments (e.g., high temperatures and chemicals used during lithographic processing of QDs and/or during manufacturing process of QD-based devices) that may adversely affect the structural and optical properties of QD 101.

Barrier layer 106 includes one or more materials that are amorphous, optically transparent and/or electrically inactive. Suitable barrier layers include inorganic materials, such as, but not limited to, inorganic oxides and/or nitrides. Examples of materials for barrier layer 106 include oxides and/or nitrides of Al, Ba, Ca, Mg, Ni, Si, Ti, or Zr, according to various embodiments. Barrier layer 106 may have a thickness 106*t* ranging from about 8 nm to about 15 nm in various embodiments. In some embodiments, thickness 106*t* may have a minimum value such that a center-to-center distance between two adjacent QDs 100, for example, in a solution, composition, and/or film is equal to or greater than a Forster radius (also referred in the art as Forster distance) in order to reduce or substantially eliminate resonance energy transfer and/or reabsorption of optical emission between the adjacent QDs 100, and consequently, improve QY of the adjacent QDs 100. In some embodiments, thickness 106*t* may have a minimum value of between about 8 nm to about 15 nm.

Forster radius refers to a center-to-center distance between two adjacent QDs, such as QDs 100 at which resonance energy transfer efficiency between these two adjacent QDs is about 50%. Having a center-to-center distance between two adjacent QDs greater than the Forster radius may decrease the resonance energy transfer efficiency and improve the optical emission properties and QY of the adjacent QDs. The process of resonance energy transfer can take place when one QD in an electronically excited state transfers its excitation energy to a nearby or adjacent QD. The resonance energy transfer process is a non-radiative quantum mechanical process. Thus, when the resonance energy transfer occurs from the one QD, the optical emission properties of the one QD may be quenched and the QY of the one QD may be adversely affected.

As illustrated in FIG. 1, barrier layer coated QD 100 may additionally or optionally include a plurality of ligands or surfactants 108, according to an embodiment. Ligands or surfactants 108 may be adsorbed or bound to an outer surface of barrier layer coated QD 100, such as on an outer surface of barrier layer 106, according to an embodiment. The plurality of ligands or surfactants 108 may include hydrophilic or polar heads 108*a* and hydrophobic or non-polar tails 108*b*. The hydrophilic or polar heads 108*a* may be bound to barrier layer 106. The presence of ligands or surfactants 108 may help to separate QD 100 and/or QD 101 from other QDs in, for example, a solution, a composition, and/or a film during their formation. If the QDs are allowed to aggregate during their formation, the quantum efficiency of QDs such as QD 100 and/or QD 101 may drop. Ligands or surfactants 108 may also be used to impart certain properties to barrier layer coated QD 100, such as hydrophobicity to provide miscibility in non-polar solvents, or to provide reaction sites (e.g., reverse micellar systems) for other compounds to bind.

A wide variety of ligands exist that may be used as ligands 108. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is diphenylphosphine.

A wide variety of surfactants exist that may be used as surfactants 108. Nonionic surfactants may be used as surfactants 108 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants may be used as surfactants 108 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, QDs 101 and/or 100 may be synthesized to emit light in one or more various color ranges, such as red, orange, and/or yellow range. In some embodiments, QDs 101 and/or 100 may be synthesized to emit light in the green and/or yellow range. In some embodiments, QDs 101 and/or 100 may be synthesized emit light in the blue, indigo, violet, and/or ultra-violet range. In some embodiments, QDs 101 and/or 100 may be synthesized to have a primary emission peak wavelength between about 605 nm and about 650 nm, between about 510 nm and about 550 nm, or between about 300 nm and about 480 nm.

QDs 101 and/or 100 may be synthesized to display a high QY. In some embodiments, QDs 101 and/or 100 may be synthesized to display a QY between 80% and 95% or between 85% and 90%.

Thus, according to various embodiments, QDs 100 may be synthesized such that the presence of barrier layer 106 on QDs 101 does not substantially change or quench the optical emission properties of QDs 101.

QY of QDs may be calculated using an organic dye as a reference. For example, rhodamine (Rh) 640 as a reference for red-emitting QDs 101 and/or 100 at the 530 nm excitation wavelength, fluorescein dye as a reference for green-emitting QDs 101 and/or 100 at the 440 nm excitation wavelength, 1,10-diphenylanthracene as a reference for blue-emitting QDs 101 and/or 100 at the 355 nm excitation wavelength. This can be achieved using the following equation:

$$\Phi_X = \Phi_{ST}\left(\frac{Grad_x}{Grad_{ST}}\right)\left(\frac{\eta_X^2}{\eta_{ST}^2}\right).$$

The subscripts ST and X denote the standard (reference dye) and the core/shell QDs solution (test sample), respectively. $\Phi_X$ is the quantum yield of the core/shell QDs, and $\Phi_{ST}$ is the quantum yield of the reference dye. Grad=(I/A), where I is the area under the emission peak (wavelength scale); A is the absorbance at excitation wavelength. η is the refractive index of the reference dye or the core/shell QDs in the solvent. See, e.g., Williams et al. (1983) "Relative fluorescence quantum yields using a computer controlled luminescence spectrometer" *Analyst* 108:1067. The references listed in Williams et al. are for green and red emitting QDs.

An Example Method for Forming a Core-Shell QDs

FIGS. 2A-2B illustrates different stages of formation of QDs 201, according to an embodiment. QDs 201 may be similar to QD 101, as described above. It should be noted that formation of three QDs has been shown in FIGS. 2A-2B for illustrative purposes. However, as would be understood by a person of skill in the art based on the description herein, the methods described below can produce any number of QDs similar to QDs 201.

Cores formation—FIG. 2A illustrates QDs 201 after formation of cores 202 and native ligands or surfactants 207, according to an embodiment. Cores 202 and native ligands 207 may be similar to core 102 and ligands 108, respectively. In an embodiment, cores 202 having native ligands or surfactants 207 attached to their outer surface may be formed using a solution-phase colloidal method. The colloidal method may include forming a first mixture comprising one or more cation precursors, one or more anion precursors, and a solvent. The method may further include heating a solution of one or more ligands or surfactants at a first temperature and forming a second mixture by rapidly injecting the first mixture into the heated solution of one or more ligands or surfactants, followed by heating the second mixture at a second temperature. The one or more ligands or surfactants can be any of the ligands or surfactants discussed above. In some embodiments, the first temperature is between about 200° C. and about 400° C. and in some embodiments, the second temperature is between about 150° C. and about 350° C. The first temperature may be selected to be sufficient enough to induce a reaction between the cation precursors and the anion precursors. The cation and anion precursors may react to form nuclei of reaction products. For example, a cation precursor such as a cadmium precursor and an anion precursor such as a selenium precursor may react in the heated mixture to form CdSe nuclei.

After this initial nucleation phase, growth of cores 202 from the nuclei may occur through addition of monomers, which are present in the second mixture, to the nuclei at the second temperature that is lower than the first temperature. The growth of cores 202 may be stopped by removing the heating at the second temperature after a desired size and/or shape is achieved. This heating process at the second temperature may last from about 1 min to about 120 min. The size and/or shape of the resulting cores 202 may be controlled by manipulating, independently or in combination, parameters such as the temperature, types of precursor materials, and ratios of ligands or surfactants to monomers, according to various example embodiments. The size and/or shape of the resulting cores 202 may be determined using techniques known to those of skill in the art. In some embodiments, the size and/or shape is determined by comparing the diameter of cores 202 before and after the addition of monomers. In some embodiments, the diameter of cores 202 before and after the addition of monomers is determined by transmission electron microscopy (TEM).

After the growth of cores 202 to a desired size and/or shape, they can be cooled. In some embodiments, cores 202 are cooled to room temperature. In some embodiments, an organic solvent is added to dilute the second mixture comprising cores 202. In some embodiments, the organic solvent is hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene.

In some embodiments, after the growth of cores 202 to a desired size and/or shape, they are isolated. In some embodiments, cores 202 are isolated by precipitating them from the solvent of the second mixture or of the diluted second mixture. In some embodiments, cores 202 are isolated by flocculation with methanol, ethanol, isopropanol, or n-butanol.

In an example of this embodiment, the cation precursors may serve as a source for the electropositive element or elements in the resulting cores 202. The cation precursor can be a group II metal (e.g., Zn, Cd, or Hg), a group III metal (e.g., Al, Ga, or In), a group IV (e.g., Ge, Sn or Pb), or a transition metal (e.g., Ti, Zr, Hf, V, Nb, Ta, Cr, Mo, W, Mn, Tc, Re, Fe, Co, Ni, Pd, Pt, Rh, and the like) precursor, according to various example embodiments. The cation precursor can constitute a wide range of substances, such as a metal oxide, a metal carbonate, a metal bicarbonate, a metal sulfate, a metal sulfite, a metal phosphate, metal phosphite, a metal halide, a metal carboxylate, a metal alkoxide, a metal thiolate, a metal amide, a metal imide, a metal alkyl, a metal aryl, a metal coordination complex, a metal solvate, or a metal salt, to provide some examples.

In another example of this embodiment, the anion precursors may serve as a source for the electronegative element or elements in the resulting cores 202. The anion precursor can be selected from the element itself (oxidation state zero), covalent compounds, or ionic compounds of the group V elements (N, P, As, or Sb), the group VI elements (O, S, Se or Te), and the group VII elements (F, Cl, Br, or I), according to various example embodiments.

Examples of the ligands used in the first mixture include dodecylamine (DA), hexadecylamine (HA), octadecylamine (OA), stearic acid (SA), lauric acid (LA), hexylphosphonic acid (HPA), tetradecylphosphonic acid (TDPA), trioctylphosphine (TOP), or trioctylphosphine oxide (TOPO). In an embodiment, the ligand and the solvent may be the same chemical used in the first mixture. For example, long-chain fatty acids and amines and TOPO may serve both the solvent and the ligand functions.

Shelling process—The core formation process may be followed by a shelling process of QDs 201, as illustrated in FIG. 2B. FIG. 2B illustrates QDs 201 after formation of shells 204. Shells 204 may be similar to shell 104, as described above. The process of forming shells 204 around cores 202 may include suspending cores 202 in a solvent or a mixture of solvents such as, but not limited to, 1-octadecene, 1-decene, 1-dodecene, or tetradecane, and heating the suspension of cores 202 at a third temperature. In some embodiments, the third temperature is between 100° C. and about 200° C. The shelling process may further include forming a third mixture by adding precursors that include elements of shells 204 at a fourth temperature. In some embodiments, the fourth temperature is between 250° C. and about 350° C. For example, cadmium precursor and sulfur precursor may be used in the third mixture for forming shells 204 comprising cadmium sulfide (CdS). In an example, shells 204 include group III-V material or group II-VI material. In another example, elements of shells 204 may be different from elements of cores 202. The materials of cores 202 and shells 204 may be selected such that the two materials have a low lattice mismatch between them. The low lattice mismatch may allow the formation of a uniform and epitaxially grown shells 204 on the surfaces of cores 202. In this method of first shell formation, cores 202 may act as the nuclei, for shells 204 to grow from their surface.

The growth of shells 204 on cores 202 may be stopped by removing the heating at the fourth temperature after a desired thickness of shells 204 on cores 202 is achieved. This heating process at the fourth temperature may last from about 50 min to about 100 min. The thickness of the resulting shells 204 may be controlled by manipulating, independently or in combination, parameters such as the temperature, types of precursor materials, and amount of precursors, according to various example embodiments.

After the growth of shells 204 to a desired thickness, the resulting core-shell QDs 201 can be cooled. In some embodiments, QDs 201 are cooled to room temperature. In some embodiments, after the formation of QDs 201, they are isolated. In some embodiments, QDs 201 are isolated by precipitation with a solvent (e.g., ethanol) and centrifugation.

In alternate embodiments, the above QD 201 formation method may include doping cores 202 during synthesis of cores 202. The doping process may be performed at any stage of QD 201 formation. For example, one or more dopant precursors may be introduced with the cation precursor or the anion precursor during cores 202 synthesis process or with the precursors during the shelling process.

The cores 202 may have one or more dopants homogeneously or heterogeneously distributed throughout the cores 202. For example, higher dopant concentration may be present at the surface of the cores 202 and lower dopant concentration may be present at the center of the cores, or vice versa. In another example, the one or more dopants may be distributed substantially uniformly over the cores 202.

According to an example of this embodiment, the one or more dopant precursors may include any suitable doping precursors such as, but not limited to, metal oxide (e.g., zinc oxide, magnesium oxide), metal acetate (e.g., zinc acetate, cobalt acetate), metal carbonate (e.g., zinc carbonate, cobalt carbonate, magnesium carbonate), metal bicarbonate (e.g., zinc bicarbonate, cobalt bicarbonate, magnesium bicarbonate), metal sulfate (e.g., zinc sulfate, magnesium sulfate, cobalt sulfate), metal sulfite (e.g., zinc sulfite, magnesium sulfite), metal phosphate (e.g., zinc phosphate, cobalt phosphate, magnesium phosphate), metal phosphite (e.g., zinc phosphite, magnesium phosphite), metal halide (e.g., zinc halide, magnesium halide), metal carboxylate (e.g., zinc carboxylate, magnesium carboxylate), metal alkoxide (e.g., zinc alkoxide, magnesium alkoxide), metal thiolate (e.g., zinc thiolate, magnesium thiolate), metal amide (e.g., zinc amide, magnesium amide), metal imide (e.g., zinc imide, magnesium imide), metal alkyl (e.g., zinc alkyl, aluminum alkyl, magnesium alkyl), or diethyl metal (e.g., diethyl zinc).

The resulting core-shell QDs 201 may have a narrow size distribution (i.e., a small
FWHM) and a high QY. In some embodiments, the photoluminescence spectrum of core-shell QDs 201 have a FWHM in a range from about 20 nm and 40 nm, from about 22 nm and 40 nm from about 24 nm and 40 nm, from about 26 nm and 40 nm, from about 28 nm and 40 nm, from about 20 nm and 36 nm, from about 20 nm and 34 nm, or from about 20 nm and 30 nm.

In some embodiments, core-shell QDs 201 may be synthesized to emit light in one or more various color ranges, such as red, orange, and/or yellow range. In some embodiments, core-shell QDs 201 may be synthesized to emit light in the green and/or yellow range. In some embodiments, core-shell QDs 201 may be synthesized to emit light in the blue, indigo, violet, and/or ultra-violet range. In some embodiments, core-shell QDs 201 may be synthesized to have a primary emission peak wavelength between about 605 nm and about 650 nm, between about 510 nm and about 550 nm, or between about 300 nm and about 480 nm.

In some embodiments, core-shell QDs 201 may be synthesized to display a high QY. In some embodiments, core-shell QDs 201 may be synthesized to display a QY between 80% and 95% or between 85% and 90%.

An Example Method for Forming CdSe/CdS Core-Shell QDs

The following example method demonstrates growth of highly luminescent
CdSe/CdS red-emitting QDs having a core/shell structure that may be similar to QDs 101 and/or 201, as described above. It is understood that the following example method is for illustrative purposes only and is not intended to limit the scope of the present invention. Also, it is understood that the following example method can be performed within a wide and equivalent range of conditions, formulations and other parameters without affecting the scope of the invention or any embodiment thereof.

CdSe cores formation—A solvent was prepared by mixing about 120 g of trioctylphosphine oxide (TOPO) and about 29 g of tetradecylphosphonic acid (TDPA) in a 500 mL three neck flask. The flask was evacuated to a vacuum of about 200 mtorr or below and then refilled with nitrogen. The evacuation-refill cycle was repeated several times (e.g., three times) to remove air from the system.

About 0.7 M to about 1M Cd precursor stock solution was prepared by mixing tri-octyl phosphine (TOP) with cadmium acetate (Cd(OAc)2). About 58 mL of this Cd precursor stock solution in TOP was loaded into a first syringe under nitrogen in a glovebox. About 1M to about 2M Se precursor stock solution of trioctylphosphine selenide (TOPSe) was prepared by dissolving Se powder in TOP at room temperature. About 25 mL of this Se precursor stock solution was loaded into a second syringe under nitrogen in a glovebox. A third and a fourth syringe was loaded with 2.5 mL diphenylphosphine (DPP) and 60 mL TOP, respectively, under nitrogen in a glovebox.

The Cd precursor solution in the first syringe was quickly injected into the solvent in the flask to form a first mixture, followed by heating of the first mixture to about 250° C. In the first mixture, Cd(OAc)2 is converted to cadmium tetradecylphosphonate. The first mixture was then cooled down to about 110° C. by air and the reaction by-products such as water and acetic acid were removed. The DPP in the third syringe was then injected into the first mixture to form a second mixture, followed by heating of the second mixture at a temperature between about 280° C. and 350° C. Once the temperature of the second mixture was stabilized, the Se precursor solution in the second syringe was swiftly injected into the second mixture to form a third mixture.

Periodically, samples of the third mixture were removed via a syringe and diluted in hexane for visible absorption spectral analysis of the growing CdSe cores in the third mixture. Once a desired CdSe core size was obtained, the TOP in the fourth syringe was injected into the third mixture to form the fourth mixture. Injection of TOP causes a sharp drop of the temperature of the fourth mixture. The fourth mixture is further cooled by air to about 50° C. The resulting CdSe cores were precipitated out of the fourth mixture by adding methanol or ethanol to the cooled mixture. The supernatant was removed from the precipitated mixture by centrifugation and the CdSe cores were obtained and suspended in hexane.

The concentration of the resulting CdSe cores is determined by UV-Vis absorption measurement. In some embodiments, the size of the resulting CdSe cores obtained using the above described method is in a range from about 2.0 nm to about 5.0 nm in diameter, from about 3.0 nm to about 5.0 nm in diameter, from about 3.5 nm to about 4.5 nm in diameter, from about 3.0 nm to about 4.5 nm in diameter, from about 2.5 nm to about 5.0 nm in diameter, from about 2.5 nm to about 4.5 nm in diameter, or from about 2.5 nm to about 3.5 nm in diameter.

Figure 3A:
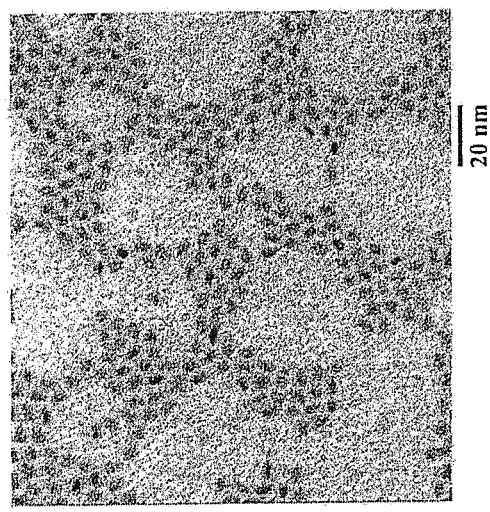

FIG. 3A shows an example TEM image of CdSe cores produced by the example method described above. The size of the resulting CdSe cores is in a range from about 2.5 nm to about 4.5 nm in diameter. The average size of the CdSe cores is about 3.5 nm.

It should be noted that besides Cd(OAc)2, other Cd source may be used for preparing the Cd precursor stock solution described above without departing from the spirit and scope of the present invention. In some embodiments, the Cd source is a cadmium iodide, cadmium bromide, cadmium carbonate, cadmium acetate, or cadmium hydroxide.

In some embodiments, the Se source for preparing the Se precursor stock solution described above is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof. In some embodiments, the selenium source is elemental selenium.

CdS shells formation on CdSe cores—Following the core formation process, a solution of the resulting CdSe cores with concentration between about 50 mg/mL and about 100 mg/mL was prepared by dispersing the washed CdSe cores in ODE. About 3.6 mL of about 66 mg/mL of this CdSe cores in ODE solution were then injected into a mixture of about 3 mL oleylamine (OYA) and about 6 mL 1-octadecene (ODE) that was prepared in a flask at room temperature. The CdSe cores in OYA-ODE mixture was then rapidly heated to about 150° C. Once the temperature reached about 150° C., about 9.3 mL of about 0.1M Cd precursor stock solution, which may grow about 1 monolayer CdS shells on the CdSe cores, was pumped into the flask at a rate of about 0.5 mL/min. The 0.1M Cd precursor stock solution was prepared by dissolving cadmium oxide (CdO) in a mixture of ODE, oleic acid (OA), and OYA at a high temperature, followed by degassing at about 110° C. to remove water.

Following the addition of the Cd precursor, the reaction temperature was quickly raised to about 310° C. This temperature was maintained until the CdS shell growth was completed. After the reaction temperature was at about 310° C. and held for about 15 min, about 9.3 mL of about 0.1M sulfur precursor stock solution was pumped into the flask at a rate of about 0.4 mL/min. The about 0.1M sulfur precursor stock solution was prepared by mixing 1-octanethiol (OT) in ODE at room temperature (RT). Following about 15 minutes after the addition of the sulfur precursor stock solution, the Cd and S precursor stock solutions were pumped into the reaction concurrently at a constant rate of about 0.4 mL/min. The amount of each precursor stock solution was based on the monolayers of CdS desired. For example, about 110 mL of each stock solution introduced into the reaction may produce about 6 monolayers of CdS shell on the CdSe cores.

It should be noted that besides CdO, other Cd source may be used for preparing the Cd precursor stock solution described above without departing from the spirit and scope of the present invention. In some embodiments, the Cd source is a cadmium iodide, cadmium bromide, cadmium carbonate, cadmium acetate, or cadmium hydroxide.

In some embodiments, the sulfur source for preparing the sulfur precursor stock solution described above is selected from elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is elemental sulfur.

After the addition of the desired amount of each precursor stock solutions, the reaction was held at about 310° C. for about another 60 min before removing the heat and cooling down the reaction to room temperature. The resulting CdSe/CdS core-shell QDs were isolated from the reaction mixture in the flask by precipitation with ethanol, followed by centrifugation, decantation of the supernatant, and drying under vacuum. The dried CdSe/CdS core-shell QDs were then re-dispersed in cyclohexane for measurements such as QY measurements.

The concentration of the resulting CdSe/CdS core-shell QDs (in nmol/mL or particle/mL) was determined by dividing the nmol or particle number value of the CdSe cores used in the synthesis by the volume of the resulting CdSe/CdS core-shell QDs-cyclohexane solution. The resulting CdSe/CdS core-shell QDs has a narrow size distribution (i.e., a small FWHM) and a high QY.

In some embodiments, the photoluminescence spectrum of the resulting CdSe/CdS core-shell QD population has a FWHM in a range from about 20 nm and 40 nm, from about 22 nm and 40 nm from about 24 nm and 40 nm, from about 26 nm and 40 nm, from about 28 nm and 40 nm, from about 20 nm and 36 nm, from about 20 nm and 34 nm, or from about 20 nm and 30 nm.

In some embodiments, the size of the resulting CdSe/CdS core-shell QDs is in a range from about 7.0 nm to about 9.0 nm in diameter, from about 7.2 nm to about 9.0 nm in diameter, from about 7.4 nm to about 9.0 nm in diameter, from about 7.6 nm to about 9.0 nm in diameter, from about 7.8 nm to about 9.0 nm in diameter, from about 8.0 nm to about 9.0 nm in diameter, from about 7.0 nm to about 8.8 nm in diameter, from about 7.2 nm to about 8.6 nm in diameter, from about 7.4 nm to about 8.4 nm in diameter, from about 7.6 nm to about 8.2 nm in diameter, or from about 7.8 nm to about 8.0 nm in diameter.

In some embodiments, the resulting CdSe/CdS core-shell QDs emit light in the red, orange, and/or yellow range. In some embodiments, the resulting CdSe/CdS core-shell QDs have a primary emission peak wavelength between about 605 nm and about 650 nm. In some embodiments, the resulting CdSe/CdS core-shell QDs display a high QY. In some embodiments, the CdSe/CdS core-shell QDs display a QY between 80% and 95% or between 85% and 90%.

FIG. 3B shows an example TEM image of CdSe/CdS core-shell QDs produced by the example methods described above. The size of the CdSe/CdS core-shell QDs is in a range from about 7.5 nm to about 8.5 nm in diameter. The average size of the CdSe/CdS core-shell QDs is about 8 nm.

Figure 4E:
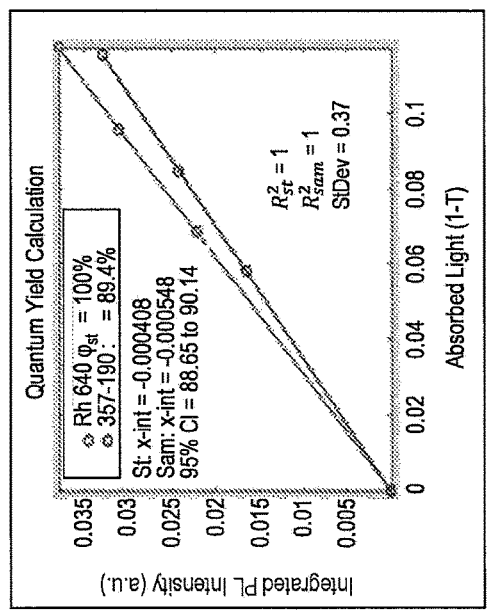
FIGS. 4A-4E illustrate example optical characteristics of CdSe based QDs, according to an embodiment.
Figure 4A:
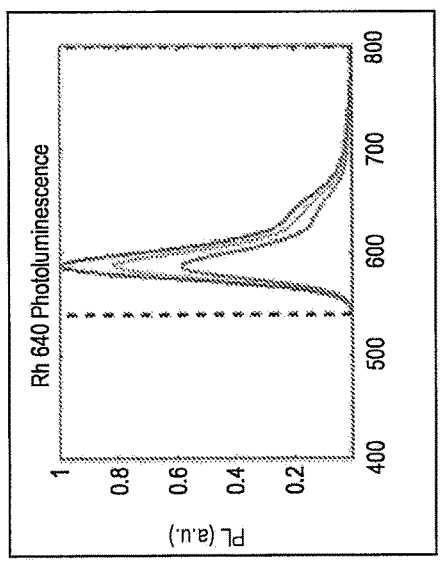
Figure 4B:
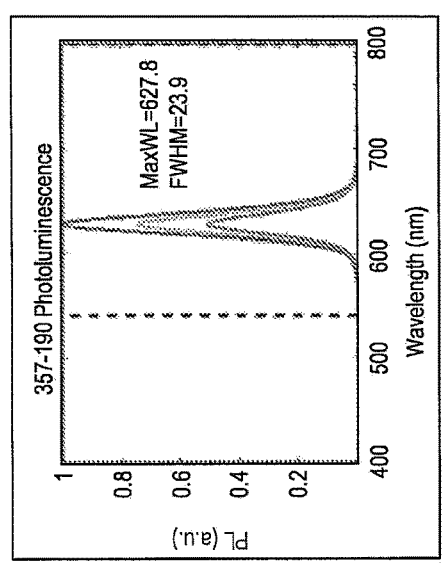
Figure 4C:
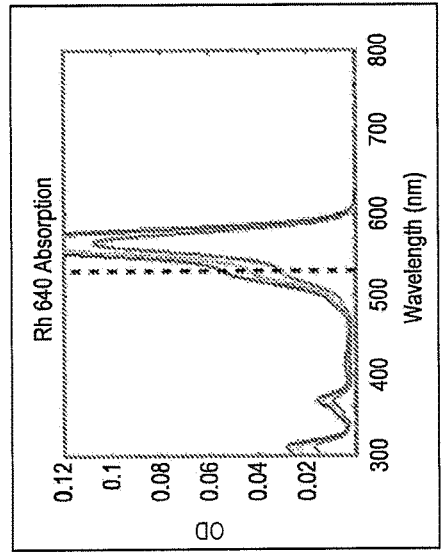
Figure 4D:
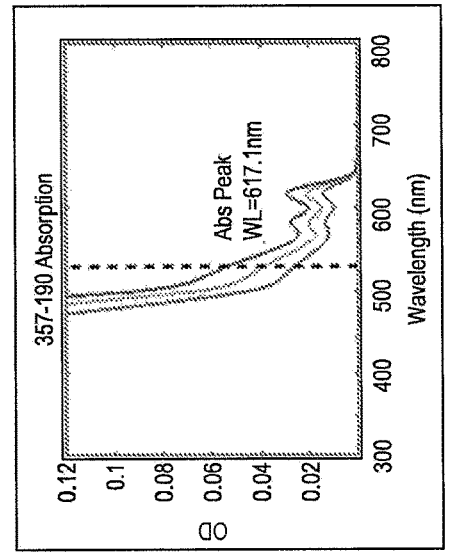

FIGS. 4A-4B show plots of absorption and photoluminescence spectra of different concentrations of the reference dye (Rh 640) with an excitation wavelength of 530 nm, respectively, for QY calculation of CdSe/CdS core-shell QDs produced by the example methods described above. FIGS. 4C-4D show plots of example absorption and photoluminescence spectra of different concentrations of the CdSe/CdS core-shell QDs with an excitation wavelength of 530 nm. FIG. 4E shows QY measurement of the CdSe/CdS core-shell QDs obtained based on FIGS. 4A-4D. In an embodiment, the QY measurement of the CdSe/CdS core-shell QDs for emission in the red region of the visible spectrum is about 89%.

An Example Method for Forming Barrier Layer Coated Core-Shell QDs

Figure 5C:
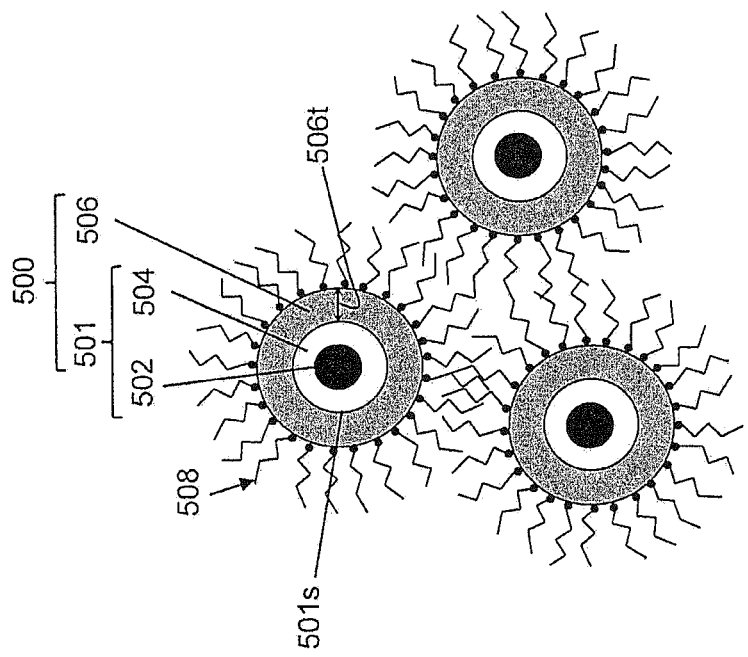
FIGS. 5A-5C illustrate a process of forming barrier layer coated QDs, according to an embodiment.
Figure 5B:
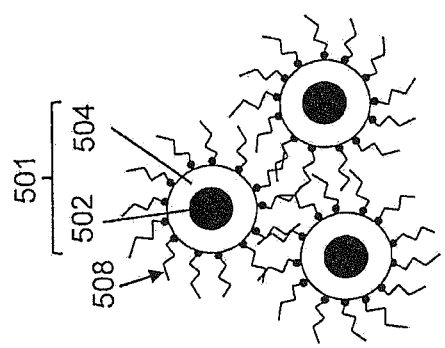
Figure 5A:
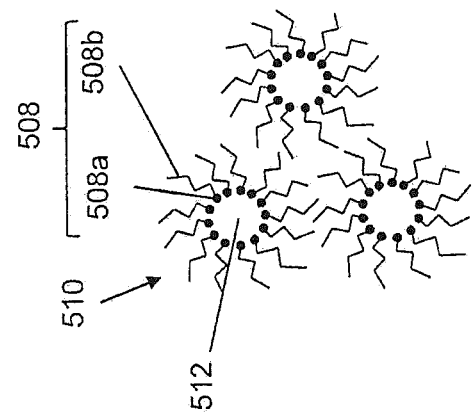

FIGS. 5A-5C illustrates formation of a barrier layer 506 on each of core-shell QDs 501 to form barrier layer coated core-shell QDs 500, according to an embodiment. Barrier layer 506 may be similar to barrier layer 106 and QDs 500 may be similar to QDs 100 described above. In an embodiment, the method of forming barrier layer 506 is based on a reverse emulsion method that includes formation of reverse micro-micelles 510. These reverse micro-micelles 510 may serve as reaction centers for coating of core-shell QDs 501 with barrier layer 506. In an embodiment, formation of barrier layer 506 may involve formation of reverse micro-micelles 510, incorporation of core-shell QDs 501 into reverse micro-micelles 510, and a coating process of the incorporated core-shell QDs 501, as described below. In some embodiments, formation of QDs 500 may additionally or optionally include an acid etch treatment performed after the coating process, that is after the formation of barrier layer 506. QDs 501 having a core 502 and one or more shells 504 may be similar to core-shell QDs 101, 201, and/or CdSe/CdSe core-shell QDs described above. Core 502 may be similar to cores 101, 202, or CdSe and one or more shells 504 may be similar to shell 104, 204, or CdS described above.

Reverse micro-micelles formation—FIG. 5A illustrates reverse micro-micelles 510 formed in a reverse emulsion (not shown), according to an embodiment. Formation of reverse micro-micelles 510 may include forming a reverse emulsion and adding surfactants 508 in the reverse emulsion. The emulsion may be formed by mixing two immiscible liquids such as a hydrophilic polar solvent and a hydrophobic non-polar solvent, according to an embodiment. Water may be used as a polar solvent and a hydrocarbon may be used as a hydrophobic non-polar solvent. Examples of hydrocarbon that can be used as a hydrophobic non-polar solvent include cyclopentane, cyclohexane, cycloheptane, toluene, or hexane. The two immiscible liquids in the reverse emulsion tend to separate into two distinct phases, a continuous phase and a non-continuous phase, due to their immiscibility with each other. In some embodiments, the two distinct phase are a continuous non-aqueous phase (e.g., hydrocarbon phase) and a non-continuous aqueous phase.

In some embodiments, the two distinct phases in the reverse emulsion may be stabilized by the addition of surfactants 508 to form a first mixture. Surfactants 508 may be similar to surfactants 108. Some examples of surfactants 508 include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), polyoxyethylene branched nonylcyclohexyl ether (Triton N-101), sodiumdioctyl sulfosuccinate, sodium stearate, sodium lauryl sulfate, sodium monododecyl phosphate, sodium dodecylbenzenesulfonate, and sodium myristyl sulfate.

Surfactants 508 may help to stabilize the non-continuous aqueous phase by forming a dispersion of reverse micro-micelles 510 in the reverse emulsion to isolate the non-continuous aqueous phase into regimes of aqueous phases within cores 512 of reverse micro-micelles 510. Each of the reverse micro-micelles 510 may be formed by a group of surfactants from among surfactants 508 added into the reverse emulsion. In some embodiments, each of the reverse micro-micelles 510 includes a hydrophilic portion formed by hydrophilic polar groups 508a (sometimes referred to as heads in the art) of surfactants 508 and a hydrophobic portion formed by hydrophobic non-polar groups 508b (sometimes referred to as tails in the art) of surfactants 508. In each of reverse micro-micelles 510, hydrophilic polar heads 508a soluble in the aqueous phase may form a hydrophilic shell around the aqueous phase contained within each of reverse micro-micelle cores 512 and corresponding hydrophobic non-polar tails 508b soluble in the continuous non-aqueous phase may form a hydrophobic shell surrounding the hydrophilic shell. In some embodiments, reverse micelles 510 have a spherical shape and the size of reverse micelles 510 can be controlled by manipulating the type and/or amount of surfactants 508 added in the reverse emulsion.

Incorporation of core-shell QDs into reverse micro-micelles—The formation of reverse micro-micelles 510 may be followed by incorporation of core-shell QDs 501 into cores 512 of reverse micro-micelles 510, as illustrated in FIG. 5B. In an embodiment, this incorporation process includes forming a QD solution having core-shell QDs 501 dispersed in a solvent (e.g., cyclohexane, toluene, or hexane). The QD solution may be formed in a process similar to that described above with reference to QDs 201 and CdSe/CdSe core-shell QDs. The incorporation process further includes forming a second mixture of the QD solution and the first mixture having reverse micro-micelles 510, according to an embodiment.

Similar to QDs 201, and/or CdSe/CdSe core-shell QDs described above, QDs 501 may have native ligands or surfactants (not shown) bonded on the outer surface of the outermost shell 504 before adding to the reverse emulsion. These native ligands or surfactants of QDs 501 may have similar affiliation to QDs 501 as the hydrophilic polar heads 508a of surfactants 508. The native ligands or surfactants (not shown here) may be dynamically bonded to QDs 501, i.e. the native ligands or surfactants may be bonded to QDs 501 in an on-and-off fashion, which may provide the opportunity for the native ligands or surfactants to be substituted by surfactants 508 in the reverse emulsion. In some embodiments, these native ligands or surfactants of QDs 501 have hydrophilic groups, which causes QDs 501 in the second mixture to be drawn to the aqueous phases isolated within cores 512 of reverse micro-micelles 510 and be enclosed within cores 512, as illustrated in FIG. 5B. Each of these QD-filled reverse micro-micelles 510 in the second mixture provides an environment or a reaction center for the formation of barrier layer 506 on each of the QDs 501 enclosed within the reverse micro-micelles 510.

In some embodiments, each of the reverse micro-micelles 510 encloses one of the QDs 501 in the second mixture. Such one-in-one incorporation of QDs 501 into reverse micro-micelles 510 may help to prevent aggregation of the QDs 501 with each other and allow individual coating of the QDs 501 with a barrier layer 506. In some embodiments, during the formation of barrier layer 506, substantially all the native ligands or surfactants of QDs 501 may be exchanged or replaced by the surfactants of the reverse micro-micelles. In some embodiments, after one or more of the QDs 501 are individually enclosed by a barrier layer 506, there may be no native ligands or surfactants left between QDs 501 and the barrier layer 506. Instead, the native ligands or surfactants may be driven out of the interface between QDs 501 and barrier layer 506 into the continuous hydrophobic phase. The native ligands or surfactants in the continuous hydrophobic phase may be bonded to the surface of the barrier layer 506. It should be noted that even though FIG. 5A-5B illustrates an equal number of QDs 501 and reverse micro-micelles 510, a person skilled in the art would understand based on the description herein that in some embodiments the number of reverse micro-micelles, similar to reverse micro-micelles 510, formed in the reverse emulsion may be greater than the number of core-shell QDs, similar to core-shell QDs 501, added to the reverse emulsion. In such embodiments, some of the reverse micelles may remain empty of core-shell QDs.

Barrier Layer formation—According to an embodiment, following the incorporation of QDs 501 into the reverse micro-micelles 510 in the second mixture, barrier layer 506 is formed on each of the incorporated QDs 501, as illustrated in FIG. 5C. In an embodiment, the formation of barrier layer 506 includes forming a third mixture of one or more precursors that have elements of barrier layer 506 and the second mixture. For example, Al, Ba, Ca, Mg, Ni, Si, Ti, or Zr precursor may be added to the second mixture for forming barrier layer 506 comprising oxides and/or nitrides of Al, Ba, Ca, Mg, Ni, Si, Ti, or Zr. In some embodiments, tetraethyl orthosilicate (TEOS), tetramethyl orthosilicate, tetrapropyl orthosilicate, or tetrabutyl orthosilicate is used as a Si precursor. The one or more precursors may be prepared as a solution and added into the second mixture at a rate between about 6 mL/min and 8 mL/min, while the second mixture may be rigorously stirred.

The formation of barrier layer 506 further includes forming a fourth mixture of one or more catalysts and the third mixture, according to an embodiment. In an embodiment, ammonia is added as a catalyst to the third mixture. The one or more catalysts may be prepared as a solution and added into the third mixture at a rate between about 4 mL/min and 7 mL/min, while the third mixture may be rigorously stirred. Both the added precursors and catalysts are drawn to QDs 501 in the aqueous phase of reverse micelles 510 due to their affiliation with the hydroxyl (OH) group. Once the added precursor and catalysts are enclosed with a corresponding one of the QDs 501 within each of the reverse micelles 510, the added one or more precursors undergo catalyzed hydrolysis to transform into an intermediate form (hydrolyzed silicon precursor). In some embodiments, surfactants 508 bonded to QDs 501 are completely substituted by hydrolyzed silicon precursors to form a monolayer of hydrolyzed silicon precursors, which further undergo condensation to form an individual coating of barrier layer 506 around the corresponding one of the QDs 501. For example, once a Si precursor such as TEOS and ammonia catalyst are drawn into and enclosed with a corresponding one of the QDs 501 within reaction center provided by each of the reverse micro-micelles 510, TEOS undergoes ammonia catalyzed hydrolysis to transform into an intermediate form, tetrahydroxysilane, which further undergoes condensation to form an individual coating of $SiO_2$ barrier layer 506 around the corresponding one of the QDs 501. In some embodiments, this hydrolysis and condensation of the one or more precursors added is performed without stirring and/or heating the fourth mixture. In some embodiments, this hydrolysis and condensation reaction may be allowed to occur from about 1 day to about 7 days until substantially all of the one or more precursors in the fourth mixture are used up.

The thickness of the barrier layer 506 formed may be controlled by manipulating, independently or in combination, parameters such as the amount of precursor, the concentration of QDs, and the hydrolysis and condensation reaction time. In an embodiment, increasing the concentration or number of QDs 501 in the second mixture for the same amount of precursors in the third mixture may reduce the thickness of the barrier layer 506.

In alternate embodiments, the amount of the one or more precursors that may be needed to achieve the desired thickness of barrier layer 506 is added in two or more stages of the barrier layer growth process. For example, a portion of the precursor amount may be added to the second mixture to make the third mixture and the remaining portion of the precursor amount may be added to the fourth mixture after the precursors of the third mixture has been used up during the hydrolysis and condensation reaction.

Barrier layer 506 may be grown to a thickness 506t ranging from about 8 nm to about 15 nm in various embodiments. In some embodiments, thickness 506t may have a minimum value such that a center-to-center distance between two adjacent QDs 500, for example, in a solution, composition, and/or film is equal to or greater than a Forster radius. In some embodiments, thickness 506t may have a minimum value of between about 8 nm to about 15 nm.

Acid Etch Treatment—After the growth of barrier layer 506 to a desired thickness, an acid etch treatment may be performed on QDs 500, according to an embodiment. In some embodiments, one or more acids may be added to the fourth mixture to form a fifth mixture. Examples of the one or more acids include acetic acid, hydrochloric acid, nitric acid, a fatty acid, or a combination thereof. In some embodiments, the molar ratio in a range from about 1.5 to about 10 may be maintained between the one or more acids and the one or more catalysts in the fifth mixture. In one embodiment, the molar ratio of about 2 may be maintained between acetic acid and ammonium hydroxide catalyst in the fifth mixture. The etching process in the fifth mixture may be performed for a time period ranging from about 5 minutes to about 2 days. The acid etch rate may be varied by varying the concentration of the one or more acids added to the fourth mixture, etching temperature, molar ratio between the one or more acids to the one or more catalysts, and/or thickness of barrier layer 506.

This post-coating acid etch treatment of QDs 500 may help to substantially reduce quenching in the optical emission properties of QDs 501. Such optical quenching may be due to reaction of QDs 501 with chemicals used during processing (e.g., catalyst used during barrier layer coating process) on QDs 501 prior to the etching process. For example, the use of ammonium hydroxide catalyst may create coordinating sites on surfaces 501s of QDs 501 for OH⁻ and $NH_4^+$ ions. These ions may serve as photoelectron trap sites on surfaces 501s, and the photoelectron trap sites may induce quenching in the optical emission properties of QDs 501. The etching of surfaces 501s during the acid etch treatment may help to etch off such photoelectron trap sites and/or other trap sites and/or defects on surfaces 501s of QDs 501 that induce optical quenching of QDs 501, and consequently, substantially reduce quenching in the optical emission properties of QDs 501. The acid etch treatment of barrier layer coated QDs 500 may be continued until QY of QDs 500 is substantially similar to QY of uncoated QDs 501. That is the acid etch treatment may be continued until negative effects of processing on QDs 501 (e.g., negative effects of buffered barrier layer coating process) are substantially reduced.

It should be noted that even though barrier layers 506 may be present on QDs 501, acid molecules or H⁺ ions from the one or more acids in the fifth mixture can penetrate through barrier layer 506, which are porous, and arrive at surfaces 501s.

In some embodiments, the acid etch treatment may be performed on QDs 501 prior to and post the barrier layer 506 formation process.

In some embodiments, the one or more catalysts (e.g., ammonium hydroxide) may be selectively removed, for example by evaporating before adding the one or more acids (e.g., acetic acid) to the fourth mixture to form the fifth mixture for the acid etch treatment of QDs 500.

The acid etch treatment may be followed by removal of the solvent, the unreacted one or more precursors, the one or more catalysts, and reaction byproducts are removed from the fifth mixture. In some embodiments, the solvent, unreacted precursors, and reaction byproducts may be removed by evaporation at a temperature between about 40° C. and about 60° C. under vacuum. The resulting concentrate after removal of the solvent and precursors may be further dried at a temperature between about 50° C. and about 70° C. under vacuum for about 60 min to about 90 min. In some embodiments, the resulting barrier layer coated core-shell QDs 500 may be isolated after the acid etch treatment by precipitation with a solvent (e.g., ethanol) and centrifugation and re-dispersed in a hydrophobic solvent such as but not limited to toluene.

The removal of the solvent, the unreacted one or more precursors, the one or more catalysts, and reaction byproducts by vacuum evaporation may ensure that surfactants 508 remain bonded to the outer surface of QDs 500 as illustrated in FIG. 5C. The hydrophobic tails 508b of surfactants 508 on barrier layer 506 provide a hydrophobic shell that ensures the dispersability of the resulting dried and isolated QDs 500 in hydrophobic environments (e.g., toluene, photoresist materials) for compatibility with, for example, device fabrication processes without adversely affecting the optical properties of the QDs 500.

In contrast to the above described post-synthesis process of QDs 500, current post-synthesis process of QDs typically includes washing the synthesized QDs in hydrophilic solvents such as ethanol, methanol, or water to separate the synthesized QDs from the reaction solution. The washing is then followed by re-dispersing of the washed QDs in hydrophilic alcohols such as ethanol or methanol. The re-dispersed QDs are then subjected to a ligand exchange process at high temperatures (e.g., about 200° C.) to introduce a new surfactant on the re-dispersed QDs. The introduction of the new surfactant is to provide a hydrophobic shell on the QDs, as the surfactants that may be present on the synthesized QDs are removed during the washing. The exposure to water or hydrophilic solvents in current post-synthesis process of QDs quenches the optical emission properties of the washed QDs as water has non-radiative centers that adversely affects the emission properties of the washed QDs. The high temperature ligand exchange process also has a negative effect on the optical emission properties of the QDs.

The isolated and re-dispersed QDs 500 may have a narrow size distribution (i.e., a small FWHM) and a high QY similar to QDs 501. In some embodiments, the photoluminescence spectrum of both QDs 501 and 500 have a FWHM in a range from about 20 nm and 40 nm, from about 22 nm and 40 nm from about 24 nm and 40 nm, from about 26 nm and 40 nm, from about 28 nm and 40 nm, from about 20 nm and 36 nm, from about 20 nm and 34 nm, or from about 20 nm and 30 nm.

In some embodiments, both QDs 500 and 501 may emit light in one or more various color ranges, such as red, orange, and/or yellow range. In some embodiments, both QDs 500 and 501 emit light in the green and/or yellow range. In some embodiments, both QDs 500 and 501 may emit light in the blue, indigo, violet, and/or ultra-violet range. In some embodiments, both QDs 500 and 501 may have a primary emission peak wavelength between 605 nm and 650 nm, between 510 nm and 550 nm, or between 300 nm and 480 nm.

In some embodiments, both QDs 500 and 501 display a high QY. In some embodiments, both QDs 500 and 501 display a QY between 80% and 95% or between 85% and 90%.

Thus, according to various embodiments, the presence of barrier layer 506 on QDs 501 does not substantially change or quench the optical emission properties of QDs 501.

In some embodiments, barrier layer coated QDs 500 subjected to acid etch treatment display a QY that is about 10% to about 20% higher than QY displayed by barrier layer coated QDs without acid etch treatment.

It should be noted that three reverse micro-micelles 510, three core shell QDs 501, and three barrier layer coated core-shell QDs 500 have been shown in FIGS. 5A-5C, respectively, for illustrative purposes. However, as would be understood by a person of skill in the art based on the description herein, the methods described above can produce any number of reverse micro-micelles, core shell QDs, and barrier layer coated core-shell QDs similar to reverse micro-micelles 510, core shell QDs 501, and barrier layer coated core-shell QDs 500, respectively.

An Example Method for Forming SiO2 coated CdSe/CdS Core-Shell QDs

The following example method demonstrates growth of highly luminescent SiO2 coated CdSe/CdS red-emitting QDs (also referred herein as SiO2 coated QDs). The SiO2 coated QDs may be similar to QDs 100 and/or 500, according to an embodiment. The SiO2 coated QDs have a core/shell structure that may be similar to QDs 101, 201, and/or 501 and also have a SiO2 barrier layer that may be similar to barrier layer 106 and/or 506 described above. It is understood that the following example method is for illustrative purposes only and is not intended to limit the scope of the present invention. Also, it is understood that the following example method can be performed within a wide and equivalent range of conditions, formulations and other parameters without affecting the scope of the invention or any embodiment thereof.

Formation of CdSe/CdS Core-Shell QDs—These QDs were prepared using the example method for forming CdSe/CdS core-shell QDs described above. A QD solution of about 230 nmol of the synthesized and dried CdSe/CdS core-shell QDs in cyclohexane was prepared.

Reverse micro-micelles formation—A first mixture of stabilized reverse emulsion having reverse micro-micelles was prepared by mixing about 100 mL IGEPAL CO-520, a surfactant, with about 750 mL cyclohexane in a 1L bottle. The first mixture was stirred for about 20 min.

Incorporation of CdSe/CdS QDs into reverse micro-micelles—After the about 20 min stirring of the first mixture, a second mixture was prepared by adding the QD solution to the first mixture. The second mixture was stirred for about 20 min after the addition of the QD solution.

Barrier Layer formation—Following the about 20 min stirring of the second mixture, a third mixture was prepared by adding about 7.4 mL of TEOS, a Si precursor, to the second mixture at a rate of about 7.4 mL/min, while the second mixture was rigorously stirred. The third mixture was stirred for about 20 min after the addition of TEOS and was followed by preparation of a fourth mixture. The fourth mixture was prepared by adding about 13.8 mL 30% ammonium hydroxide solution, a catalyst, to the third mixture at a rate of about 4.6 mL/min to about 6.9 mL/min, while the third mixture was rigorously stirred. The fourth mixture was stirred for about 2 min after the addition of the catalyst. Following the about 2 min stirring, the bottle including the fourth mixture was capped and stored for about 1 to about 7 days without stirring or heating the fourth mixture.

At the end of the 1 to 7-day reaction, the solvent, the unreacted TEOS, the ammonium hydroxide, and reaction byproducts such as ethanol were evaporated at or below a temperature of about 50° C. under vacuum to yield SiO2 coated QDs having surfactant IGEPAL CO-520 on their outer surfaces similar to, for example, QDs 500 described above. The resulting SiO2 coated QDs were further dried at or below a temperature of about 60° C. under vacuum for about 60 min to remove substantially all moisture from them. Following the drying of the SiO2 coated QDs, they were isolated by precipitation and centrifugation and re-dispersed in toluene to form a stable hydrophobic solution.

The re-dispersed SiO2 coated QDs exhibited a narrow size distribution (i.e., a small FWHM) and a high QY. In some embodiments, the photoluminescence spectrum of the SiO2 coated QD population has a FWHM in a range from about 20 nm and 40 nm, from about 22 nm and 40 nm from about 24 nm and 40 nm, from about 26 nm and 40 nm, from about 28 nm and 40 nm, from about 20 nm and 36 nm, from about 20 nm and 34 nm, or from about 20 nm and 30 nm.

In some embodiments, the size of the resulting SiO2 coated CdSe/CdS QDs is in a range from about 20 nm to about 50 nm in diameter, from about 24 nm to about 50 nm in diameter, from about 28 nm to about 50 nm in diameter, from about 32 nm to about 50 nm in diameter, from about 35 nm to about 50 nm in diameter, from about 20 nm to about 45 nm in diameter, from about 24 nm to about 45 nm in diameter, from about 30 nm to about 45 nm in diameter, from about 35 nm to about 45 nm in diameter, or from about 25 nm to about 35 nm in diameter. In some embodiments, the average size of the SiO2 coated CdSe/CdS core-shell QDs is about 25 nm, about 35 nm, or about 40 nm.

In some embodiments, the thickness of the SiO2 barrier layer of the SiO2 coated QDs is in a range from about 8 nm to about 20 nm, from about 10 nm to about 20 nm, from about 15 nm to about 20 nm, from about 8 nm to about 15 nm, or from about 10 nm to about 15 nm.

In some embodiments, the SiO2 coated QDs emit light in the red, orange, and/or yellow range. In some embodiments, the resulting SiO2 coated QDs have a primary emission peak wavelength between about 605 nm and about 650 nm, between about 615 nm and about 640 nm, between about 620 nm and about 635 nm, or between about 625 nm and about 630 nm.

In some embodiments, the SiO2 coated QDs display a QY between 80% and 95% or between 85% and 90%.

Figure 6:
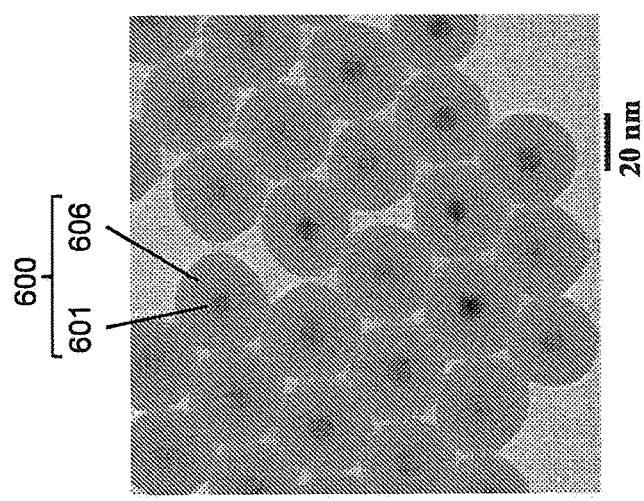
FIG. 6 illustrates a transmission electron micrograph of barrier layer coated QDs, according to an embodiment.

FIG. 6 shows an example TEM image of a plurality of SiO2 coated CdSe/CdS QDs 600 produced by the example methods described above. Each SiO2 coated CdSe/CdS QDs 600 includes a CdSe/CdS QD 601 and a SiO2 barrier layer 606 surrounding the CdSe/CdS QD 601. The size of the SiO2 coated CdSe/CdS QDs is in a range from about 31 nm to about 35 nm in diameter.

Figure 7A:
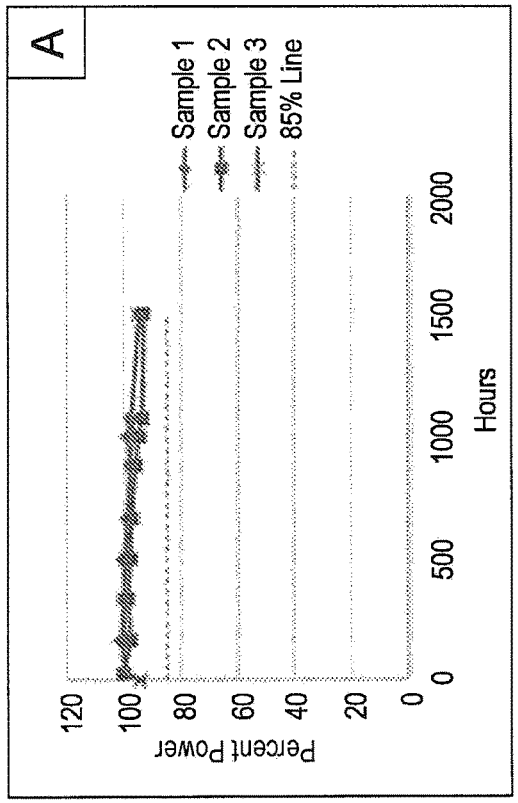
FIGS. 7A-7B illustrate example optical characteristics of barrier layer coated QDs, according to an embodiment.
Figure 7B:
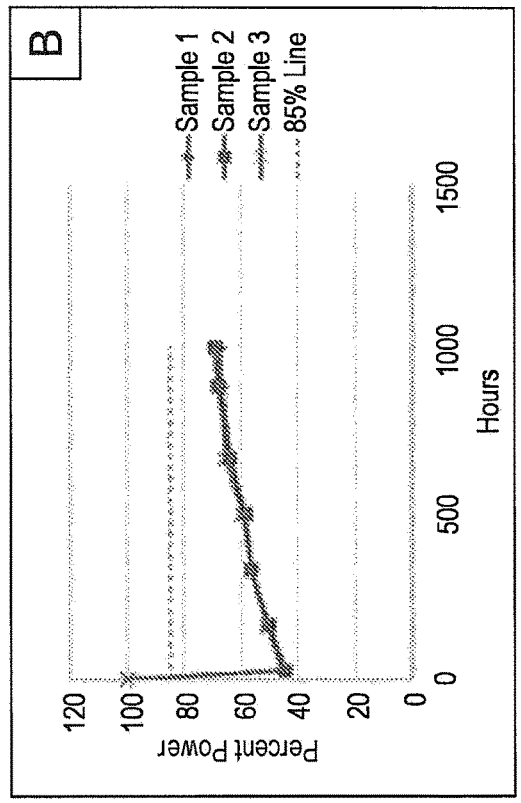

FIGS. 7A-7B show example optical performance plots of SiO2 coated CdSe/CdS

QDs and CdSe/CdS QDs, respectively, over a period of time when exposed to continuous 200 mW/cm$^2$ flux at 450 nm. These SiO2 coated CdSe/CdS QDs and CdSe/CdS QDs are produced by the example methods described above. Comparison of the optical performances in FIGS. 7A and 7B shows the SiO2 coated CdSe/CdS QDs exhibiting a higher stability performance over a period of time under high flux light exposure compared to the CdSe/CdS QDs without the SiO2 coating. This comparison demonstrates that the SiO2 barrier layer helps to protect the coated CdSe/CdS QDs from harsh environment.

Example optical properties of SiO2 coated CdSe/CdS QDs and CdSe/CdS QDs produced by the example methods described above are presented in Table 1 below. As shown in Table 1, for both sizes of SiO2 coated CdSe/CdS QDs, the SiO2 barrier layer formation process and/or presence of the SiO2 barrier layer coating on the CdSe/CdS QDs does not quench or degrade the optical properties of the CdSe/CdS QDs. There is hardly any difference observed between the optical properties of the CdSe/CdS QDs with and without the SiO2 coating, as shown in Table 1. The higher QY observed in the 25 nm SiO2 coated QDs than the 35 nm SiO2 coated QDs may be due to a higher amount of fluorescence quenching precursors and catalysts such as TEOS, ammonium hydroxide, and water being assigned to the QDs in the reverse micro-micelles during the formation of the 35 nm QDs having thicker SiO2 coating that the 25 nm SiO2 coated QDs.

TABLE 1

Example optical data for CdSe/CdS QDs and SiO2 coated CdSe/CdS QDs

| Sample No. | Average size of QDs in diameter (nm) | Description | Emission Wavelength (nm) | FWHM (nm) | QY (%) |
|---|---|---|---|---|---|
| 1 | 25 | CdSe/CdS QDs | 627.8 | 23.9 | 89.4 |
| 2 |  | SiO2 coated CdSe/CdS QDs | 626.7 | 24.9 | 92.6 |
| 3 |  | SiO2 coated CdSe/CdS QDs | 627.1 | 24.9 | 93.9 |

TABLE 1-continued

Example optical data for CdSe/CdS QDs and SiO2 coated CdSe/CdS QDs

| Sample No. | Average size of QDs in diameter (nm) | Description | Emission Wavelength (nm) | FWHM (nm) | QY (%) |
|---|---|---|---|---|---|
| 4 | | SiO2 coated CdSe/CdS QDs | 627.7 | 25.1 | 92.4 |
| 5 | | SiO2 coated CdSe/CdS QDs | 627.1 | 25.0 | 93.3 |
| 6 | | SiO2 coated CdSe/CdS QDs | 627.5 | 25.3 | 92.4 |
| 7 | | CdSe/CdS QDs | 630.1 | 27.3 | 86.9 |
| 8 | 35 | SiO2 coated CdSe/CdS QDs | 629.6 | 27.5 | 82.4 |
| 9 | | SiO2 coated CdSe/CdS QDs | 629.1 | 27.6 | 84.3 |
| 10 | | SiO2 coated CdSe/CdS QDs | 629.5 | 27.2 | 82.3 |
| 11 | | SiO2 coated CdSe/CdS QDs | 630.9 | 28.0 | 80.7 |
| 12 | | SiO2 coated CdSe/CdS QDs | 630.8 | 28.2 | 84.8 |

Example Steps for Forming Barrier Layer Coated Core-Shell QDs

Figure 8:
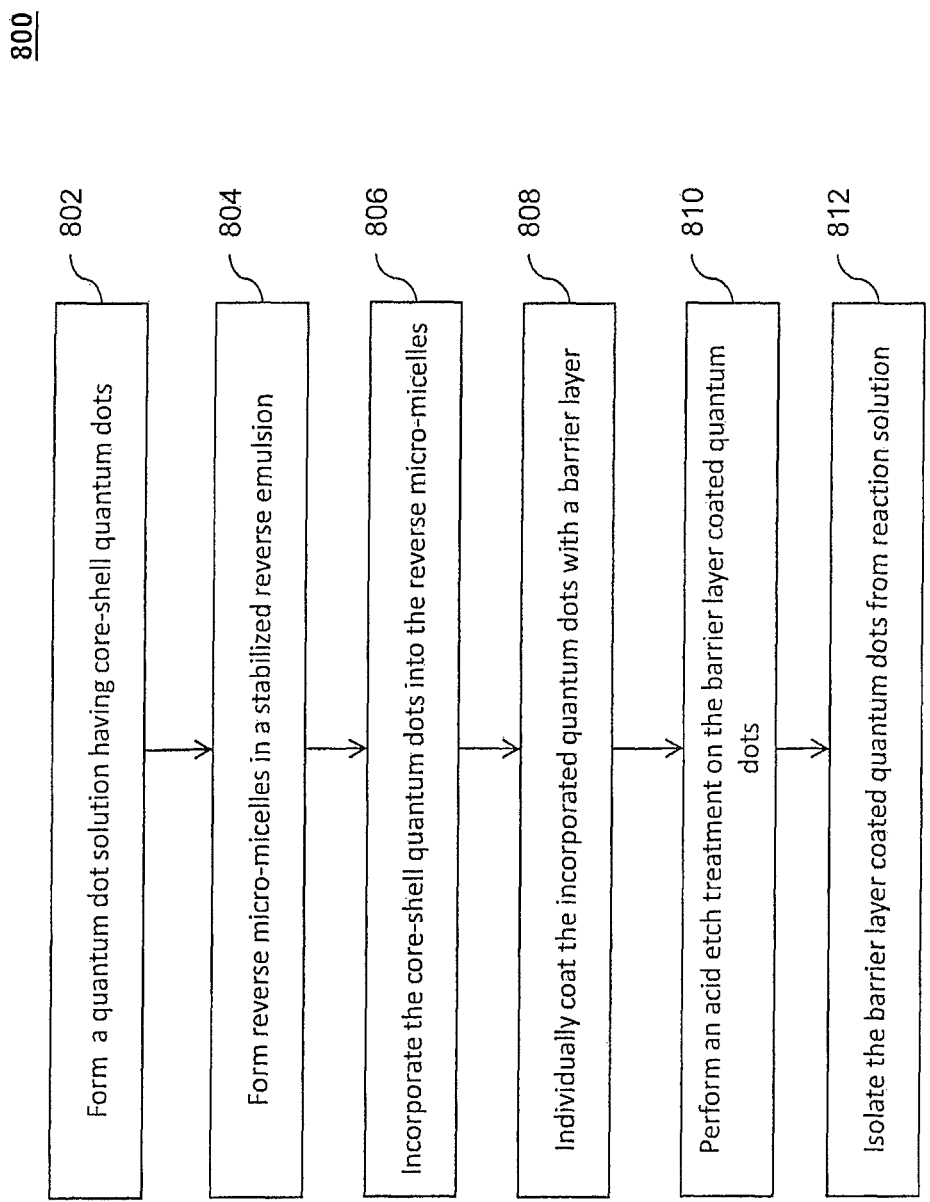
FIG. 8 is a flowchart for forming oxide coated QDs, according to an embodiment.

FIG. 8 illustrates a flowchart for making barrier layer coated core-shell QDs, according to an embodiment. Method 800 may be performed to form QDs similar to QDs 100, 101, 201, 500, 501, 600, and 601. Method 800 is not intended to be exhaustive and other steps may be performed without deviating from the scope or spirit of the invention. Solely for illustrative purposes, the steps illustrated in FIG. 8 will be described with reference to example processes illustrated in FIGS. 2A-2B and 5A-5C. Steps can be performed in a different order or not performed depending on specific applications.

In step 802, a QD solution having core-shell QDs is formed, according to an embodiment. For example, QD solution having core-shell QDs may be produced by dispersing core-shell QDs such as QDs 101, 201, and/or 501 in a solvent (e.g., cyclohexane, toluene, or hexane).

In step 804, reverse micro-micelles formed in a stabilized reverse emulsion, according to an embodiment. For example, reverse micro-micelles in a stabilized reverse emulsion may be produced by forming a first mixture of one or more surfactants (e.g., IGEPAL CO-520, IGEPAL CO-630, IGEPAL CA-630, Triton X-100, or Brij 53) with hydrophobic solvents such as, but not limited to, cyclopentane, cyclohexane, or cycloheptane and stirring the first mixture for about 20 min.

In step 806, the core-shell QDs are incorporated into the reverse micro-micelles, according to an embodiment. For example, the core-shell QDs are incorporated into the reverse micro-micelles by forming a second mixture of the QD solution and the first mixture and stirring the second mixture for about 20 min.

In step 808, the incorporated QDs are individually coated with a barrier layer, according to an embodiment. For example, the incorporated QDs are individually coated with a barrier layer by forming a third mixture of one or more precursor solution and the second mixture and stirring the third mixture for about 20 min. The formation of third mixture is followed by forming a fourth mixture of one or more catalysts and the third mixture and stirring the fourth mixture for about 2 min. Following the about 2 min stirring, the bottle including the fourth mixture is capped and stored for 7 days without stirring or heating the fourth mixture.

In step 810, the resulting barrier layer coated QDs are subjected to an acid etch treatment, according to an embodiment. For example, the resulting barrier layer coated QDs are subjected to an acid etch treatment by forming a fifth mixture of one or more acids and the fourth mixture and treating the resulting barrier layer coated QDs in the fifth mixture for about 12 hours. In some embodiments, step 810 may be an optional step.

In step 812, the barrier layer coated QDs are isolated from the fifth mixture, according to an embodiment. For example, the acid etch treated barrier layer coated QDs are isolated by evaporating the solvent, the unreacted precursors, the catalysts, and reaction byproducts at or below a temperature of about 50° C. under vacuum to yield barrier layer coated QDs having surfactants on their outer surfaces similar to, for example, QDs 500 described above. The evaporation is followed by further drying of the acid etch treated barrier layer coated QDs at a temperature of about 60° C. under vacuum for about 60 min to remove substantially all moisture from them. Following the drying, the acid etch treated barrier layer coated QDs are isolated by precipitation and centrifugation.

An Example Embodiment of a QD Film

Light emitting QDs such as QDs 100, 500, and/or 600 discussed above may be used in a variety of applications that benefit from having sharp, stable, controllable, and defined angular optical emissions in the visible and infrared spectrum. Such applications may use the light emitting QDs in the form of a QD film 900 as shown in FIG. 9. In some applications, the light emitting QDs may be cast as a QD film 900 on a substrate and patterned by a photolithographic process. Display devices such as organic light emitting diode (OLED) display devices or liquid crystal display (LCD) devices may use such a QD film 900, for example as a color down conversion layer. In such display devices, QD film 900 may be part of their display panel or pixel units of their display panel and may be disposed on light sources or substrates of the display devices, according to some embodiments.

Typically, non-QD-based color down conversion layers in display devices can range from about 1 μm to about 10 μm in thickness. In order to achieve similar or higher optical density and QY from QD-based color down conversion layers of similar thickness, such as QD film 900, a large density of QDs may need to be loaded and closely packed (i.e., adjacent QDs in substantial contact with each other) within QD film 900 without the QDs being aggregated with each other. However, QDs prepared by current methods tend to aggregate and/or reabsorb emission of adjacent QDs when closely packed in a QD film and consequently, due to quenching of their optical properties, suffer from lower QY compared to non-QD-based color down conversion layers. In some embodiments, such problems may be overcome by using QD films of barrier layer coated core-shell QDs such as QDs 100, 500, and/or 600. The barrier layer may help to prevent these QDs from aggregating and reabsorbing each other's emission and consequently, achieve high optical density and QY even when these QDs are closely packed in a QD film of about 1 μm to about 3 μm. The barrier layer of these QDs may also help to protect them from harsh environments (e.g., heat, chemicals) during processing of QD films.

The barrier layer coated core-shell QDs such as QDs 100, 500, and/or 600 in QD films such as QD film 900 may also help to achieve thinner and/or single layered QD-based color conversion optical films compared to current multi-layered QD-based color conversion optical films of QD-based display devices. The thinner and/or single layered QD-based color conversion optical films may meet the requirements for color conversion optical films in today's mobile display applications and/or future display applications such as wearable display devices. Some of these requirements may be for color conversion optical films having a maximum thickness of less than about 75 μm, a defined angular light emission property, and/or a minimal or no edge degradation around perimeters of the color conversion optical films.

The current multi-layered QD-based color conversion optical films are not able to meet such requirements, which may be critical for mobile display applications that require thin as possible components and bezel-free displays. These current multi-layered QD-based optical films include QD films interposed between polymer plastic based substrates that serve as barrier films to protect the QDs in the QD films from ambient environment and/or supporting structures for the QD films. Such use of polymer plastic based substrates make the total thickness of these current optical films equal to or greater than about 175 μm. As the barrier layer coated core-shell QDs such as QDs 100, 500, and/or 600 in QD films such as QD film 900 are individually coated with barrier layers, the use of polymer plastic based substrates can be eliminated. As a result, the thickness of color conversion optical films having QD films such as QD film 900 may be reduced to less than about 75 μm. In some embodiments, QD film 900 may include barrier layer coated core-shell QDs such as QDs 100, 500, and/or 600 embedded in polymer plastic film that are optically transparent to the optical emissions from the embedded QDs. The polymer plastic film may provide mechanical support and additional protection from environment to QD film 900 without increasing its total thickness over the maximum thickness requirement in display applications.

Also, in order to achieve defined angular optical emission additional optical films such as brightness enhancement films (BEFs) may be used in these current optical films, which increases their total thickness over 175 μm. In some embodiment, defined angular optical emission may be achieved in color conversion optical films having QD films such as QD film 900 without using such BEFs. In some embodiments, barrier layer coated core-shell QDs such as QDs 100, 500, and/or 600 may be embedded in BEFs or other optically transparent layers of display devices to form QD films such as QD film 900.

It is to be appreciated that QD films such as QD film 900 including barrier layer coated core-shell QDs such as QDs 100, 500, and/or 600 embedded in polymer plastic films, BEFs, or other optically transparent layers, as discussed above, may not require any additional substrates for casting the barrier coated QDs and/or for supporting the QD films. In some embodiments, QD films such as QD film 900 may be stacked with other optical film and such stack may have a thickness in a range from about 70 μm to about 200 μm.

FIG. 9 illustrates a cross-sectional view of a QD film 900, according to an embodiment. QD film 900 may include a plurality of barrier layer coated core-shell QDs 902 and a matrix material 910, according to an embodiment. QDs 902 may be similar to QDs 100, 500, and/or 600 in structure, function, and/or characteristics and may be embedded or otherwise disposed in matrix material 910, according to some embodiments. As used herein, the term "embedded" is used to indicate that the QDs are enclosed or encased within matrix material 910 that makes up the majority component of the matrix. It should be noted that QDs 902 may be uniformly distributed throughout matrix material 910 in an embodiment, though in other embodiments QDs 902 may be distributed according to an application-specific uniformity distribution function. It should be noted that even though QDs 902 are shown to have the same size in diameter, a person skilled in the art would understand that QDs 902 may have a size distribution. Similar to QDs 500, and/or 600, QDs 902 may have a narrow size distribution and high QY.

In an embodiment, QDs 902 may include a homogenous population of QDs having sizes that emit in the blue visible wavelength spectrum, in the green visible wavelength spectrum, or in the red visible wavelength spectrum. In other embodiments, QDs 902 may include a first population of QDs having sizes that emit in the blue visible wavelength spectrum, a second population of QDs having sizes that emit in the green visible wavelength spectrum, and a third population of QDs that emit in the red visible wavelength spectrum.

Matrix material 910 may be any suitable host matrix material capable of housing QDs 902. For example, BEFs or other optically transparent layer of display devices may be the host matrix material to house QDs 902. Suitable matrix materials may be chemically and optically compatible with QDs 902 and any surrounding packaging materials or layers used in applying QD film 900 to devices. Suitable matrix materials may include non-yellowing optical materials which are transparent to both the primary and secondary light, thereby allowing for both primary and secondary light to transmit through the matrix material. In an embodiment, matrix material 910 may completely surround each of the QDs 902. The matrix material 910 may be flexible in applications where a flexible or moldable QD film 900 is desired. Alternatively, matrix material 910 may include a high mechanical strength, non-flexible material.

In another embodiment, matrix material 910 may have low oxygen and moisture permeability, exhibit high photo- and chemical-stability, exhibit favorable refractive indices, and adhere to outer surfaces of QDs 902, thus providing an air-tight seal to protect QDs 902. In another embodiment, matrix material 910 may be curable with UV or thermal curing methods to facilitate roll-to-roll processing.

Matrix material 910 may include polymers and organic and inorganic oxides. In some embodiments, matrix material 910 may be an extrudable material, that is a material that may be capable of being extruded in a film extrusion process. Suitable polymers for use in matrix material 910 may be any polymer known to the ordinarily skilled artisan that can be used for such a purpose. The polymer may be substantially translucent or substantially transparent. Matrix material 910 may include, but not limited to, epoxies, acrylates, norbornene, polyethylene, poly(vinyl butyral): poly(vinyl acetate), polyurea, polyurethanes, polypropylene, polycarbonate, or a combination thereof; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides which combine with ligand amines (e.g., APS or PEI ligand amines) to form epoxy, and the like.

In some embodiments, matrix material 910 includes scattering microbeads such as $TiO_2$ microbeads, ZnS microbeads, or glass microbeads that may improve photo conversion efficiency of QD film 900.

According to some embodiments, QD film 900 may be formed by mixing QDs 902 in a polymer (e.g., photoresist) and casting the QD-polymer mixture on a substrate, mixing QDs 902 with monomers and polymerizing them together, mixing QDs 902 in a sol-gel to form an oxide, or any other method known to those skilled in the art.

According to some embodiments, the formation of QD film 900 may include a film extrusion process as illustrated in FIG. 9A. The film extrusion process may include forming a homogenous mixture 911 of matrix material 910 and barrier layer coated core-shell QDs such as QDs 100, 500, and/or 600, introducing the homogenous mixture into a top mounted hopper 914 that feeds into an extruder 916. In some embodiments, the homogenous mixture 911 may be in the form of pellets. The film extrusion process may further include extruding QD film 900 from a slot die 918 and passing extruded QD film 900 through chill rolls 920. In some embodiments, the extruded QD film 900 may have a thickness less than about 75 µm, for example, in a range from about 70 µm to about 40 µm, from about 65µm to about 40 µm, from about 60 µm to about 40 µm, or from about 50 µm to about 40 µm. In some embodiments, the formation of QD film 900 may optionally include a secondary process followed by the film extrusion process. The secondary process may include a process such as co-extrusion, thermoforming, vacuum forming, plasma treatment, molding, and/or embossing to provide a texture 913 to a top surface 900s of QD film 900, as shown in a cross-sectional view of QD film 900 in FIG. 9B. The textured top surface 900s of QD film 900 may help to improve, for example defined optical diffusion property and/or defined angular optical emission property of QD film 900.

FIG. 10 shows an example photoluminescence spectrum of a QD film including $SiO_2$ coated CdSe/CdS QDs in a matrix material. The $SiO_2$ coated CdSe/CdS QDs are produced by the example methods described above. Plot 1020 of FIG. 10 illustrates the primary emission peak wavelength of the QD film at about 625 nm for an excitation peak wavelength at about 405 nm.

Table 2 below shows example optical data for two sets of QD films as function of baking temperature. The two sets of QD films were prepared by mixing $SiO_2$ coated CdSe/CdS QDs with a carboxyl acrylate polymer, dispersing the mixture in an organic solvent, and casting the QDs-polymer-solvent blend into a layer of about 2 µm to about 4 µm thick by spin-coating on substrates. The QD films were then baked at different temperatures and their optical properties were measured. One set of QD films was prepared with $SiO_2$ coated CdSe/CdS QDs having an average size of about 25 nm in diameter and the other set of QD films was prepared with $SiO_2$ coated CdSe/CdS QDs having an average size of about 35 nm in diameter. Both sizes of $SiO_2$ coated CdSe/CdS QDs were prepared by the example methods described above.

As illustrated by the optical data in Table 2, the two sets of QD films exhibit external quantum efficiency (EQE) at about 50% for a baking temperature of about 250° C. This EQE is much higher than the EQE observed for QD films having CdSe/CdS QDs without the $SiO_2$ barrier layer. The optical data in Table 2 also shows that very small differences are observed between the FWHMs and the emission wavelengths of the $SiO_2$ coated CdSe/CdS QDs and the QD films. Such small differences may indicate that the $SiO_2$ barrier layer prevented aggregation of the $SiO_2$ coated CdSe/CdS QDs and quenching of their optical properties even when they are closely packed in the QD films to achieve high optical density as in Table 2.

TABLE 2

Example optical data for QD films as a function of baking temperature

| Sample No. | Average size of QDs in diameter (nm) | QY of QDs (%) | FWHM of QDs (nm) | Emission Wavelength of QDs (nm) | Baking temp. (° C.) | EQE (%) | Optical density | Emission Wavelength of QD film (nm) | FWHM of QD film (nm) |
|---|---|---|---|---|---|---|---|---|---|
| 1 | 25 | 84.8 | 28.2 | 630.8 | 60 | 64.66 | 0.265 | 630.42 | 26.96 |
| 2 | | | | | 180 | 61.61 | 0.247 | 627.07 | 25.73 |
| 3 | | | | | 250 | 49.60 | 0.244 | 625 | 25 |
| 4 | 35 | 80.7 | 28 | 630.9 | 60 | 63.46 | 0.325 | 631.54 | 27.72 |
| 5 | | | | | 180 | 56.7 | 0.326 | 625 | 25 |
| 6 | | | | | 250 | 51.4 | 0.270 | 625 | 25 |

Table 3 below shows example optical data for a QD film as function of exposure to air over a period of time. The QD film was prepared by mixing SiO2 coated CdSe/CdS QDs with a carboxyl acrylate polymer, dispersing the mixture in an organic solvent, and casting the QDs-polymer-solvent blend into a layer of about 1 µm to about 10 µm thick by spin-coating on a substrate, followed by baking the QD film at about 250° C. for about 30 minutes. The QD film was exposed to air for different periods of time and its optical properties were measured. The SiO2 coated CdSe/CdS QDs were prepared by the example methods described above.

The optical data in Table 3 illustrates optical stability of the QD film over a period of time. The EQE of the QD film remained substantially unchanged over a period of 24 days under air exposure.

TABLE 3

Example optical data for QD films as a function of exposure to

| Time (days) | EQE (%) | Optical density | Emission Wave-length of QD film (nm) | FWHM of QD film (nm) |
|---|---|---|---|---|
| 0 | 48.7 | 0.084 | 629 | 26 |
| 3 | 48.6 | 0.084 | 628 | 25 |
| 6 | 49.8 | 0.088 | 628 | 25 |
| 18 | 48 | 0.086 | 627 | 25 |
| 24 | 48.7 | 0.089 | 627 | 24 |

Example Embodiments of a QD film based Display Device

Figure 11:
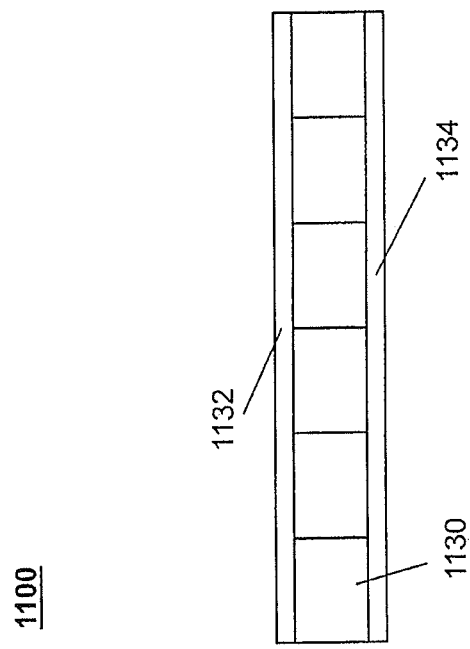
FIG. 11 illustrates a cross-sectional view of a display panel of a display device, according to an embodiment.

FIG. 11 illustrates a schematic of an exploded cross-sectional view of a display panel 1100 of a display device, according to an embodiment. In some embodiments, the display device is an OLED display device or LCD device. Display panel 1100 may include a plurality of pixel units 1130, a transmissive cover plate 1132, and a back plate 1134, according to an example of this embodiment. Even though FIG. 11 shows display panel 1100 having few pixel units 1130, a skilled person would understand that display panel 1100 of a display device may include an one or two dimensional array of pixel units and any number of pixel units without departing from the general concept of the present invention.

The cover plate 1132 may serve as an optically transparent substrate on which other components (e.g., electrode) of the display device may be disposed and/or may act as an optically transparent protective cover for pixel units 1130. In some embodiments, pixel units 1130 may be tri-chromatic having red, green, and blue sub-pixel units. In some embodiments, pixel units 1130 may be monochromatic having either red, green, or blue sub-pixel units. In some embodiments, display panel 1100 may have a combination of both tri-chromatic and monochromatic pixel units 1130. In some embodiments, pixel units 1130 may have two or more sub-pixel units.

Typically, pixel units in display panels have a light source and color filters and light emitted from these pixel units are produced by color filtering of white light sources to produce red, green, and blue pixels in a display device. However, the use of color filters is not an energy efficient process as undesired wavelengths, i.e., light energies are filtered out. Current display devices have used QD films as a color down conversion film in pixel units to reduce the loss of light energy due to filtering. QDs have a very broad absorption characteristics below their emission wavelength, and as a result may absorb and convert many of the wavelengths radiating from the light source to the desired wavelength of the pixel unit. One of the disadvantages of current QD-based display devices is that the high optical density and high QY are not achieved with thin QD films of few micrometers or less. The QDs tend to aggregate if they are closely packed in thin QD films as discussed above. Such disadvantage may be overcome with the use QD films such as QD film 900 including barrier layer coated QDs such as QDs 100, 500, 600, and/or 900, discussed above, as color down conversion film in pixel units of display devices.

Figure 12:
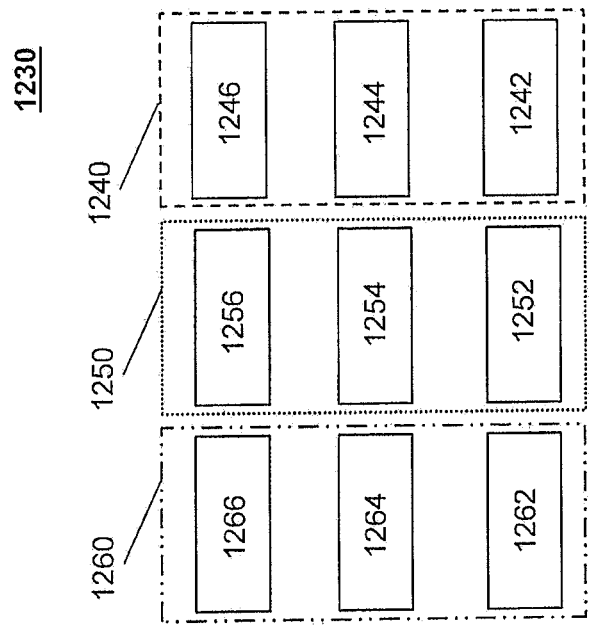
FIG. 12 illustrates a schematic of an exploded cross-sectional view of a QD film based pixel unit of a display device, according to an embodiment.

FIG. 12 illustrates an exploded cross-sectional view of a tri-chromatic pixel unit 1230 of a display panel of a display device, according to an embodiment. In some embodiments, the display device is an OLED display device or LCD device. In an example, pixel unit 1230 may be similar to pixel unit 1130 and may be implemented as part of display panel 1100. In another example, at least one of the pixel units 1130 may have a configuration similar to pixel unit 1230. Pixel unit 1230 may include a red sub-pixel unit 1240, a green sub-pixel unit 1250, and a blue sub-pixel unit 1260. Red sub-pixel unit 1240 may include a white or blue light source 1242, a QD film 1244 including red-emitting QDs (e.g., QDs 100, 500, 600) disposed on an emitting surface of the light source 1242, and an optically transparent substrate 1246. In some embodiments, light source 1242 and QD film 1244 are substantially in contact with each other. As the red-emitting QDs of QD film 1244 may absorb substantially all wavelengths (i.e., substantially all light energy) radiating from the light source 1242, the use of a red color filter to block out non-red wavelengths radiating from the light source may be eliminated in red sub-pixel unit 1240, according to an embodiment. In some embodiments, the white light source 1242 is a white OLED or a white LED. The white OLED may include an organic layer configured to emit white light.

Green sub-pixel unit 1250 may include a white or blue light source 1252, a QD film 1254 including green-emitting QDs (e.g., QDs 100, 500) disposed on an emitting surface of the light source 1252, and a green color filter 1256. In some embodiments, light source 1252 and QD film 1254 are substantially in contact with each other and QD film 1254 and filter 1256 are substantially in contact with each other. The green-emitting QDs of QD film 1254 may absorb substantially all wavelengths smaller and pass substantially all wavelengths higher than their emission wavelength radiating from the light source 1252. As such, a green color filter 1256 may be used in green sub-pixel unit 1250 to filter out the higher wavelengths (e.g., wavelength corresponding to red light), according to an embodiment. In some embodiments, the white light source 1252 is a white OLED or a white LED.

Blue sub-pixel unit 1260 may include a white light source 1262, an optically transparent substrate 1264 and a blue color filter 1266. A blue color filter 1266 may be used in blue sub-pixel unit 1260 to filter out wavelengths radiating from the light source that are higher than blue emission wavelength (e.g., wavelengths corresponding to red and/or green light), according to an embodiment. In an embodiment, the white light source is a white OLED. In an alternate embodiment, blue sub-pixel unit 1260 may include a UV light source 1262, a QD film 1254 including blue-emitting QDs (e.g., QDs 100, 500) disposed on an emitting surface of the light source 1262, and a blue color filter 1266. In some embodiments, light source 1262 and QD film 1264 are substantially in contact with each other and QD film 1264 and filter 1266 are substantially in contact with each other. The blue-emitting QDs of QD film 1264 may absorb substantially all wavelengths smaller and pass substantially all wavelengths higher than their emission wavelength radiating from the light source 1262. As such, a blue color filter 1266 may be used in blue sub-pixel unit 1260 to filter out the higher wavelengths (e.g., wavelengths corresponding to red and/or green light), according to an embodiment. In some embodiments, the UV light source is a UV LED.

The invention also provides a QD-based light emitting diode (LED) comprising a light source unit, a QD film such as QD film 900 comprising a population of barrier layer coated QDs such as QDs 100, 500, and/or 600 disposed on the light source unit, and an optical element disposed on the film layer, according to an embodiment. The light source unit may be configured to emit light at a primary emission peak wavelength smaller than a primary emission peak wavelength emitted by the population of barrier layer coated QDs.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications of such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A display device comprising:
   an organic layer that emits a broadband radiation; a quantum dot film disposed on the organic layer, comprising:
   barrier layer coated quantum dots that absorb a set of wavelengths of the broadband radiation and emit at a primary emission peak wavelength, a longest wavelength of the set of wavelengths being smaller than the primary emission peak wavelength,
   wherein each of the barrier layer coated quantum dots includes a core-shell quantum dot and an optically transparent barrier layer surrounding the core-shell quantum dot, and
   wherein the barrier layer coated quantum dots exhibit a quantum yield greater than about 80%, and
   a matrix material configured to house the barrier layer coated quantum dots and be in substantial contact with the optically transparent barrier layer; and
   an optical element, disposed on the quantum dot film, configured to block another set of wavelengths of the broadband radiation that are greater than the primary emission peak wavelength.

2. The display device of claim 1, wherein the optically transparent barrier layer is configured to provide a spacing between adjacent barrier layer coated quantum dot to prevent their aggregation.

3. The display device of claim 2, wherein the spacing is equal or greater than a Forster radius between adjacent barrier layer coated quantum dots.

4. The display device of claim 1, wherein the organic layer, the quantum dot film, and the optical element are part of a pixel unit of the display device.

5. The display device of claim 1, wherein the optical element is a color filter.

6. The display device of claim 1, wherein the barrier layer comprises an oxide.

7. The display device of claim 1, wherein the quantum dot film further comprises surfactants or ligands bonded to the optically transparent barrier layer.

8. The display device of claim 1, wherein the optically transparent barrier layer is configured to protect the core-shell quantum dot from degradation by light flux, heat, oxygen, moisture, or a combination thereof.

\* \* \* \* \*